US008222698B2

(12) United States Patent
Salcedo et al.

(10) Patent No.: US 8,222,698 B2
(45) Date of Patent: Jul. 17, 2012

(54) BOND PAD WITH INTEGRATED TRANSIENT OVER-VOLTAGE PROTECTION

(75) Inventors: Javier Salcedo, North Billerica, MA (US); Alan Righter, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 369 days.

(21) Appl. No.: 12/686,003

(22) Filed: Jan. 12, 2010

(65) Prior Publication Data
US 2010/0327343 A1    Dec. 30, 2010

Related U.S. Application Data

(63) Continuation-in-part of application No. 12/493,692, filed on Jun. 29, 2009, now Pat. No. 8,044,457.

(51) Int. Cl.
| H01L 23/62 | (2006.01) |
| H01L 23/58 | (2006.01) |
| H01L 23/48 | (2006.01) |
| H01L 23/52 | (2006.01) |
| H01L 29/40 | (2006.01) |

(52) U.S. Cl. .................... 257/355; 758/494; 758/786
(58) Field of Classification Search .......... 257/355–360, 257/494, 758–762, 786, E29.008, E29.015
See application file for complete search history.

(56) References Cited

U.S. PATENT DOCUMENTS

| 5,663,860 | A  | 9/1997  | Swonger |
| 5,742,084 | A  | 4/1998  | Yu |
| 6,137,140 | A  | 10/2000 | Efland et al. |
| 6,236,087 | B1 | 5/2001  | Daly et al. |
| 6,512,662 | B1 | 1/2003  | Wang |
| 6,590,273 | B2 | 7/2003  | Okawa et al. |
| 6,667,870 | B1 | 12/2003 | Segervall |
| 7,038,280 | B2 * | 5/2006 | Righter ......................... 257/355 |
| 7,071,528 | B2 | 7/2006  | Ker et al. |
| 7,232,705 | B2 | 6/2007  | Righter |
| 7,335,543 | B2 | 2/2008  | Chen et al. |
| 7,345,341 | B2 | 3/2008  | Lin et al. |
| 7,601,991 | B2 | 10/2009 | Salcedo et al. |
| 7,714,357 | B2 * | 5/2010 | Hayashi et al. ............... 257/758 |
| 2002/0122280 | A1 | 9/2002 | Ker et al. |
| 2004/0207021 | A1 | 10/2004 | Russ et al. |
| 2005/0087807 | A1 | 4/2005 | Righter |
| 2005/0093069 | A1 | 5/2005 | Logie |
| 2005/0151160 | A1 | 7/2005 | Salcedo et al. |
| 2006/0145260 | A1 | 7/2006 | Kim |
| 2006/0186467 | A1 | 8/2006 | Pendharkar et al. |
| 2008/0067601 | A1 | 3/2008 | Chen |
| 2009/0309128 | A1 | 12/2009 | Salcedo et al. |

FOREIGN PATENT DOCUMENTS

EP    0 168 678 A2    1/1986

OTHER PUBLICATIONS

Anderson et al., *ESD Protection under Wire Bonding Pads*, EOS/ESD Symposium 99-88, pp. 2A.4.1-2A.4.7.
International Search Report and Written Opinion, dated Mar. 25, 2011, in PCT Appl. No. PCT/US2011/020036, filed Jan. 3, 2011.
Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.
Salcedo et al., Electrostatic Discharge Protection Framework for Mixed-Signal High Voltage CMOS Applications, IEEE Xplore, downloaded Feb. 23, 2010 at 12:53 EST.

* cited by examiner

*Primary Examiner* — Cuong Q Nguyen
(74) *Attorney, Agent, or Firm* — Knobbe Martens Olson & Bear LLP

(57) ABSTRACT

In various embodiments, the invention relates to bond pad structures including planar transistor structures operable as over-voltage clamps.

28 Claims, 24 Drawing Sheets

TEST PARAMETERS
LEAKAGE TEST VOLTAGE: 15.00 V
LEAKAGE CURRENT LIMIT: 2.50E-3 A
MAXIMUM PULSE VOLTAGE: 250.00 V
START PULSE VOLTAGE 0.50 V
TEST STEP VOLTAGE: 1.00 V
PULSE CURRENT LIMIT: 3.00 A
PULSE WIDTH: 100 ns
PULSE RISE TIME: 10.0 ns
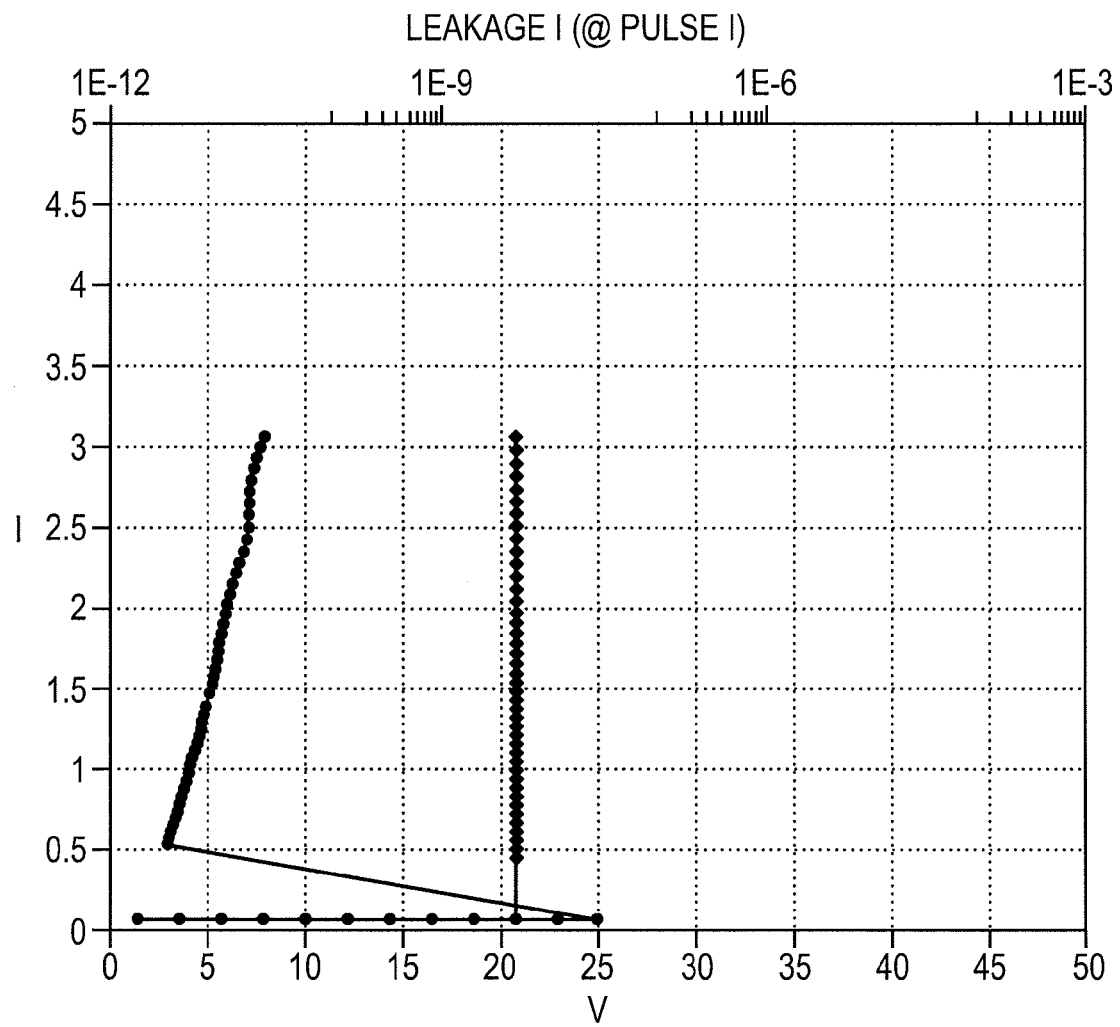
FIG. 2A TEST PARAMETERS
LEAKAGE TEST VOLTAGE:                      15.00 V
LEAKAGE CURRENT LIMIT:                   2.50E-3 A
MAXIMUM PULSE VOLTAGE:                 250.00 V
START PULSE VOLTAGE                        0.50 V
TEST STEP VOLTAGE:                           1.00 V
PULSE CURRENT LIMIT:                        3.00 A
PULSE WIDTH:      100 ns
PULSE RISE TIME:   10.0 ns
LEAKAGE I (@ PULSE I)
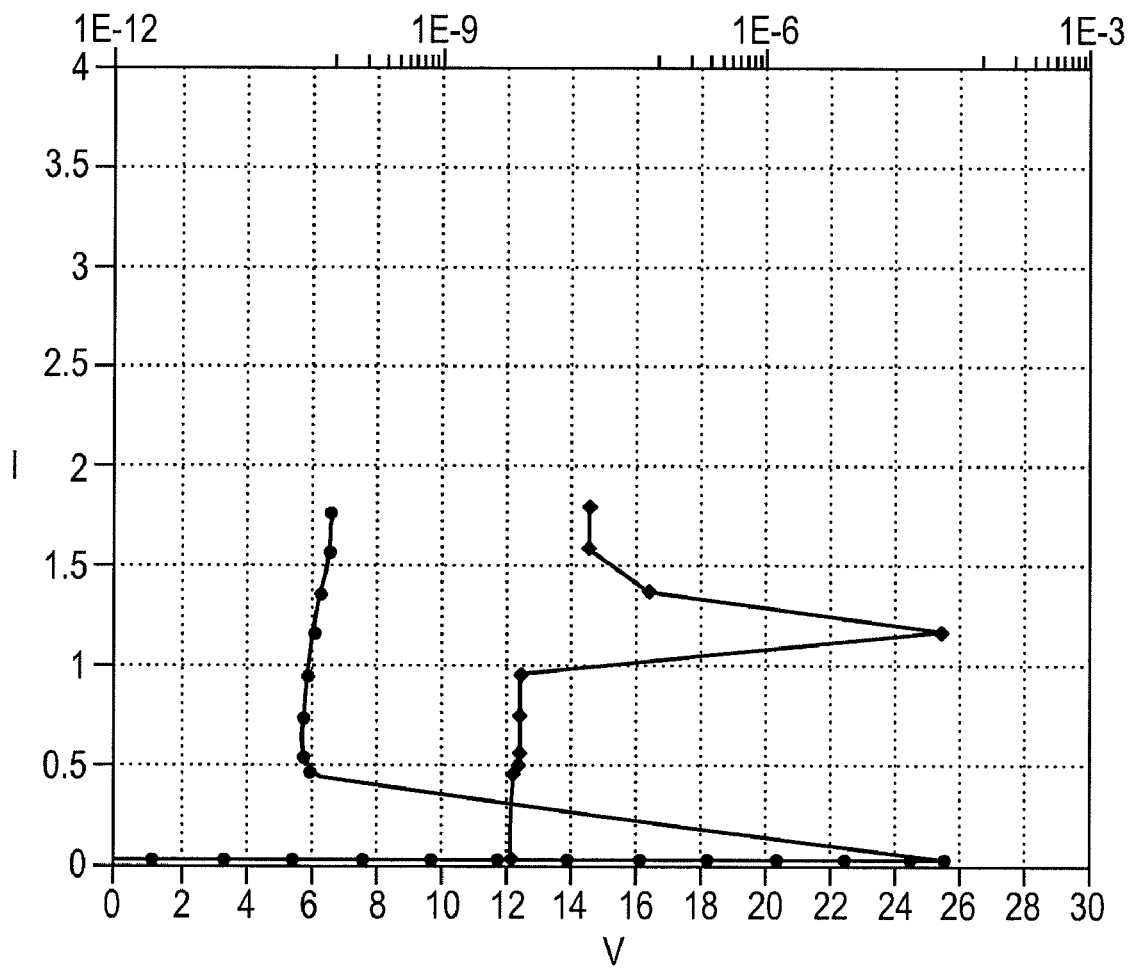
FIG. 2B

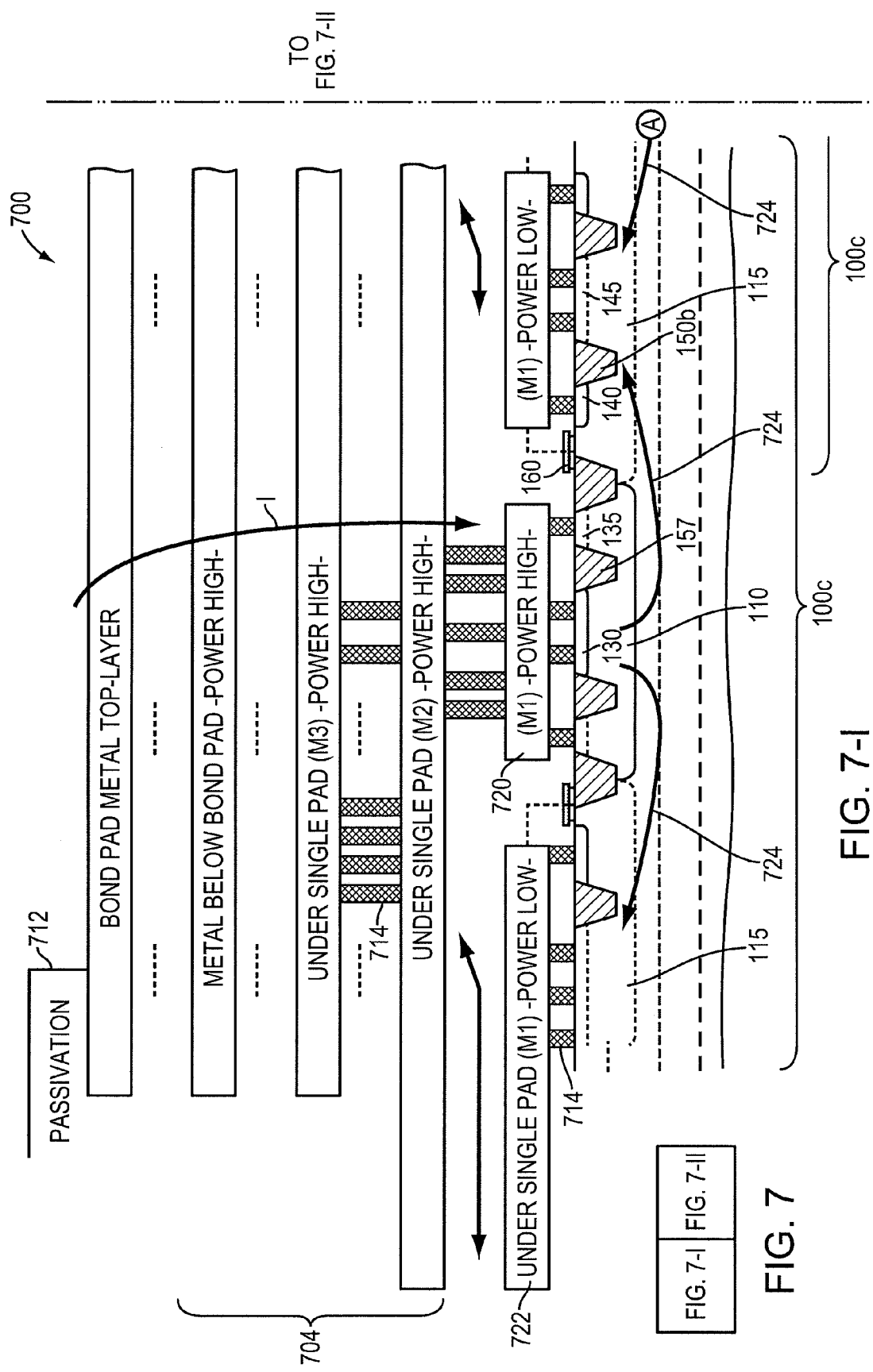

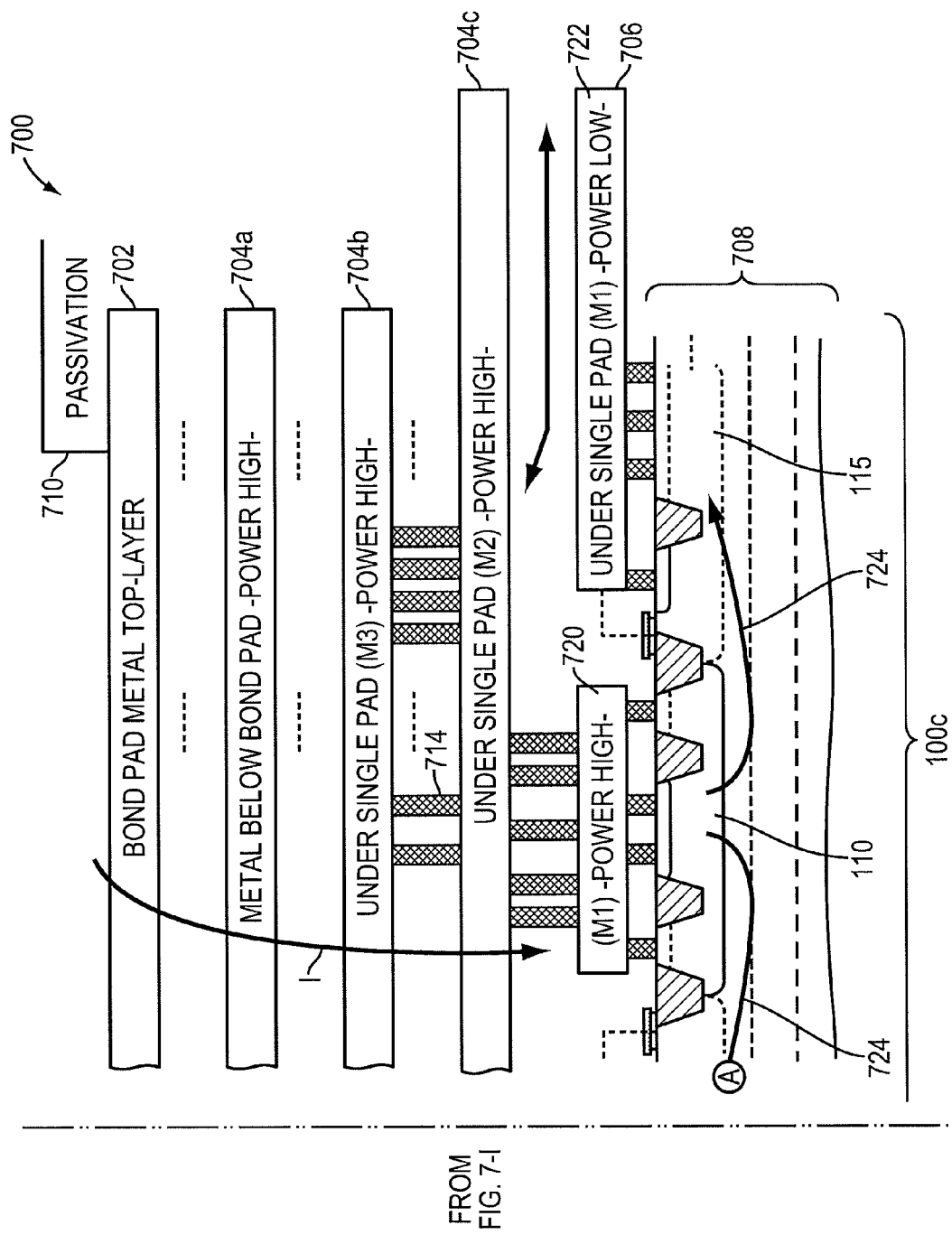
FIG. 7-II

FIG. 9-I

| FIG. 9-I | FIG. 9-II |

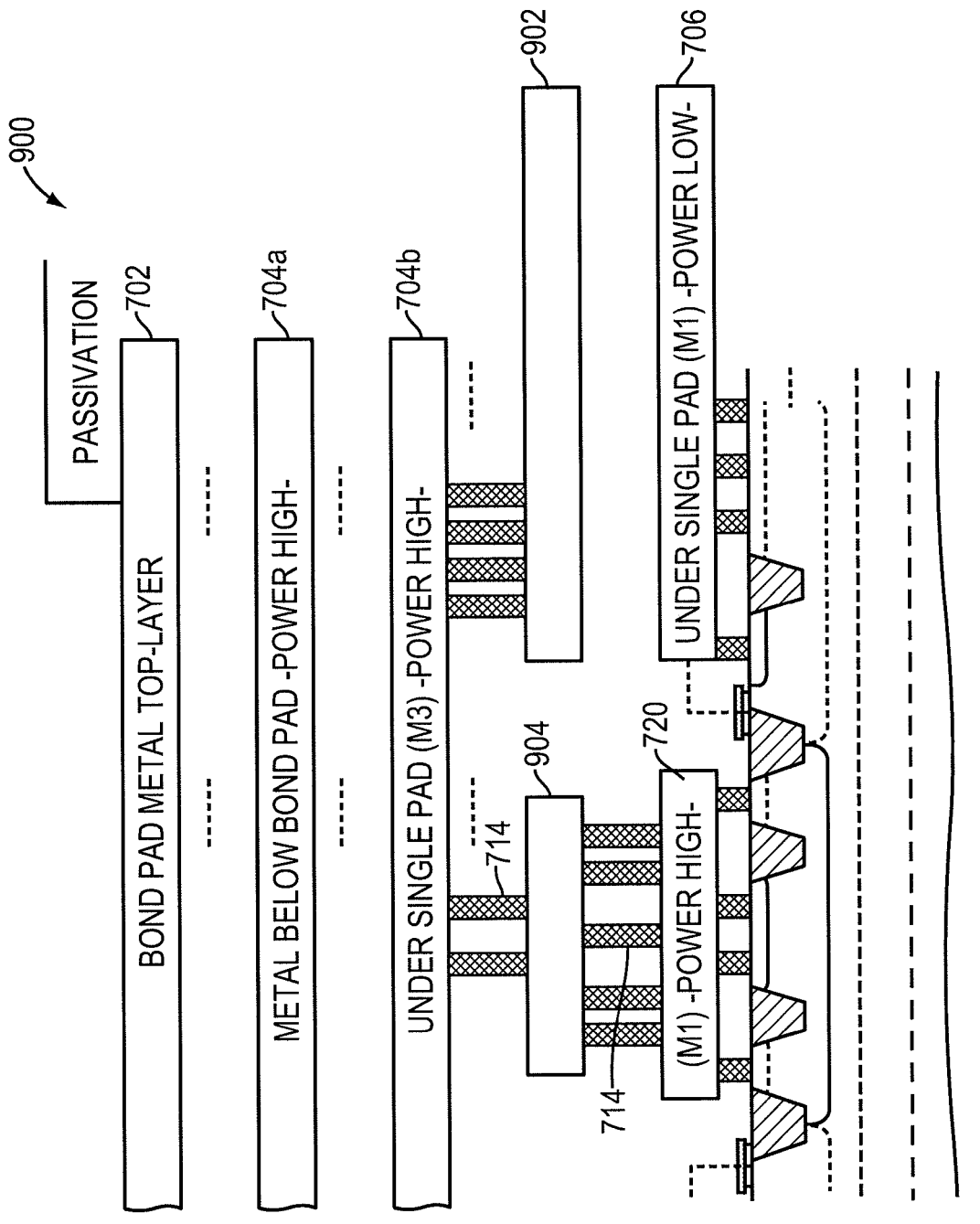
FIG. 9-II

BOND PAD WITH INTEGRATED TRANSIENT OVER-VOLTAGE PROTECTION

CROSS-REFERENCE TO RELATED APPLICATION

This application is a continuation-in-part of U.S. patent application Ser. No. 12/493,692, filed on Jun. 29, 2009, the disclosure of which is hereby incorporated herein by reference in its entirety.

FIELD OF THE INVENTION

Embodiments of the invention relate, generally, to semiconductor structures for over-voltage protection, and methods of manufacturing the same. More particularly, various embodiments relate to integrated circuit (IC) bond pads with over-voltage protection circuitry.

BACKGROUND

Emerging high-voltage ICs are increasingly susceptible to damage resulting from electrical overstress (EOS) and electrostatic discharge (ESD), i.e., sudden unwanted voltage build-up and currents due to electrical charge displacement during IC assembly and system handling or operation. This is, in particular, a limiting factor in the design for reliability for those technologies that combine devices operating at a variety of internal and external interface voltage levels, such as advanced imaging and industrial systems technologies.

Clamp circuits are often used to shunt ESD currents between the power supply rails of the IC and limit voltage spikes, thereby protecting the internal elements from damage. In the absence of excess voltages at the IC input or output, the clamp circuits should not affect operation of the full IC system. Thus, the current flow through the clamp device is close to zero at voltages up to a trigger voltage level at which current conduction occurs, which should be significantly above the operating voltage of the IC, but below a predetermined voltage level where relatively small internal circuit devices can suffer damage due to the over-voltage condition. Once the trigger voltage is reached, the clamp becomes conductive. In some clamp devices, the voltage between the terminals of the clamp structure then drops to a holding voltage below the trigger voltage, in which condition the device is able to discharge a larger amount of current and dissipate a relatively low power per unit area. Following this current-voltage "snapback," the clamp device typically conducts a high transient current between its terminals, and if the current conduction condition is not destructive, the leak current at the lower operating voltage stays in the nano-Ampere regime after the overvoltage stress condition has passed.

Many clamp circuits implemented as metal-oxide-semiconductor (MOS) structures are variations of standard low-voltage or high-voltage MOSFET structures. In particular, for high-voltage applications, high-voltage double-diffused (vertical) metal-oxide semiconductor (DDMOS) or planar extended-drain MOS devices may be used. These MOS structures, which are able to operate at relatively large voltages, are themselves very sensitive to ESD-induced damage because they conduct currents largely near the surface, and exhibit limited bulk conduction (i.e., current conduction in deeper regions of the substrate). Failing devices typically develop a large electric field close to the high-voltage MOS junction breakdown voltage (i.e., the trigger voltage), followed by soft failure after a first snapback, and final permanent damage after a second snapback. Soft failure is typically characterized by an initial increase in the leakage current of the device, which poses reliability problems over time and degrades the power efficiency of the system. After a soft-failure, the device is still functional, but elevated leakage currents are more likely obtained under subsequent stress conditions, which may result in permanent device damage. This intrinsic sensitivity to ESD stress renders it difficult to meet customer- and industry-standard reliability requirements in IC applications using conventional high-voltage MOS technologies, and to enable more extensive and advanced circuit functionality on the same chip.

These technology challenges may be addressed by stacking multiple low-voltage devices to implement a higher-voltage ESD switch. However, the feasibility of this approach depends on the ability to isolate the low-voltage devices from the substrate, and to allocate large area for the high-voltage input-output (IO) terminals and the clamp implementation. Due to cost and manufacturing considerations, isolating the devices to realize high-voltage clamping is not practicable in a number of high-voltage mixed-signal developments. In high-voltage technologies where buried layer or deep-well isolation cannot be used in the implementation of the clamp, it is not feasible to stack devices because the high-voltage and low-voltage devices share a common substrate, and the low-voltage devices cannot be connected directly to a high-voltage input or output terminal. Further, isolating layers form reverse-biased junctions with the semiconductor substrate during normal circuit operation and—due to the large area of the junction—can result in significant leakage buildup. Leak current injection, in turn, degrades the energy efficiency of the IC system.

An alternative solution involves large high-voltage planar MOS designed to self-protect during a high ESD transient over-voltage. This large-foot-print approach may be practical for output drivers that need to handle high current levels and meet predetermined on-state resistance and switching speed requirements. However, many emerging output driver circuits include relatively small HV-MOS devices, and, thus, are not self-protected. Over-sizing the device is often not possible due to circuit functionality, energy efficiency, packaging, cost, and silicon-area constraints. Further, high-voltage power-supply clamps that include large high-voltage planar MOS also provide a large capacitance and may be sensitive to false activation by fast voltage changes.

Voltage clamps are typically located at the periphery of an IC, adjacent and connected to the bond pads, which connect the IC, via wires to the pins of the IC package; the pins, in turn, connect to other components of the system in which the IC is utilized. While ICs have undergone significant decreases in feature sizes, the ESD pulses that they need to withstand have remained the same. Consequently, although the density of other circuits has increased, the chip area required to dissipate the ESD pulse has remained nearly constant. In addition, the number of bond pads on a chip has increased with increasing circuit complexity. These trends have resulted in bond pads and ESD protection circuitry occupying a significant proportion (e.g., 10-15%) of the total chip area on many ICs. To reduce the required chip area, bond pads with integrated ESD protection circuitry have been proposed for low-voltage applications. These integrated designs are, however, not readily applicable to high-voltage conditions because the fundamental circuit architectures and associated signal processing applications, as well as the characteristics of power rails and the distribution of pads around the periphery of the chip, generally differ between low-voltage and high-voltage circuits, and further between single-voltage (e.g., digital) and mixed-signal high-voltage circuits. For example, certain features of standard low-voltage structures, such as a common low-voltage bus shared between the power and input/output terminals of the ICs and pull-up/pull-down ESD-robust MOS protection pad drivers cannot be used in or connected to high-voltage designs.

A new approach is desirable to address ESD-related layout, manufacturing, and reliability problems associated with high-voltage ICs (particularly, with large integrated Systems-on-Chip (SoC)) in various advanced automotive, medical, industrial, and consumer applications. The high-voltage pads with integrated over-voltage protection preferably consume a minimum area of the pad ring, yet combine mixed-signal interfaces, multiple voltage levels, and variable power-low and power-high reference voltages. The different reference voltages often pose constraints on the layout of the power rails, which have implications for the overall product reliability. Minimizing the resistance of the power rails around the integrated circuit becomes a problem when the rails are interrupted to connect to integrate a pad connected to a high-voltage signal. With increasing functionality and modularity of the ICs, overcoming the limitations of existing approaches to over-voltage clamping in mixed-signal high-voltage applications becomes increasingly important.

Accordingly, there is a need for effective, small-footprint over-voltage clamp structures for high-voltage MOS applications, which are preferably seamlessly integrated into high-voltage bond pads and form a fundamental part of the mixed-signal integrated circuit pad ring.

SUMMARY

The present invention provides, in various embodiments, over-voltage clamp structures that combine a small footprint with rapid triggering, and are suitable for high-voltage applications and integration into bond pads. In some embodiments, such over-voltage clamp structures include modified planar high-voltage MOS devices that feature additional doped regions to provide for an increased conductivity modulation across the (parasitic) lateral bipolar junctions. The increased conductivity modulation decreases surface junction over-heating and provides a better control of the critical electric field in the drain-body junction. In preferred embodiments, the clamp structures do not exhibit soft-failure leakage after first snapback, and greatly extend the ESD robustness while significantly reducing the device area. The term MOS as used herein includes structures wherein the gate is made of polysilicon, as opposed to metal, and/or wherein the isolating layer is of a material other than an oxide.

In certain embodiments, the invention provides bond pad structures with integrated over-voltage clamp structures. The bond pads may connect the IC to power and/or signal buses. During over-voltage conditions, the over-voltage clamp structure may shunt currents to a power-return bus, which may connect the bond pad to ground. The clamp structure typically includes a plurality of transistors (hereinafter also referred to as "clamp devices" or simply "devices") that are arranged in parallel along their widths. Since the "length" of a transistor customarily denotes the dimension across transistor junctions, from source to drain, the term "width" herein refers to the dimension parallel to the junctions (i.e., the boundaries between the differently doped regions), which is generally perpendicular to the length. The width, so defined, may be longer than the length. In fact, to maximize the current-shunting capability of the integrated structure, the clamp devices are preferably elongated along their widths, and oriented width their widths perpendicular to the power-return bus. Further, the clamp devices may be arranged in the bond pad structure in a symmetric fashion, which serves uniform current distribution and, hence, optimized current-carrying capability.

In a first aspect, the invention provides, in various embodiments, a bond pad structure including a substrate with multiple planar over-voltage clamp devices, a patterned metal layer disposed above the substrate, and a bus. The over-voltage clamp devices are elongated along their width in a certain direction, and include high-side regions (i.e., regions that may, in operation, be connected to a power supply bus or, more generally, to the more positive terminal) and low-side regions (i.e., regions that may, in operation, be connected to a power return bus or, more generally, to the more negative terminal). The patterned metal layer includes one or more conductive islands that are elongated in the same direction as the clamp devices and aligned with and electrically connected to the high-side regions. Further, the patterned metal layer includes a conductive area surrounding the conductive island(s) that is electrically connected with the low-side regions. The bus, which may be a power-return bus, is oriented substantially perpendicular (e.g., at an angle between 85° and 95°, preferably between 89° and)91° to the direction of elongation of the clamp devices and conductive island(s), and includes at least a portion of the conductive area surrounding the conductive island(s). The planar over-voltage clamp devices are configured to shunt currents, under over-voltage conditions, from the conductive island(s) to the bus.

A second metal layer (or multiple layers) may be disposed above the first, patterned metal layer and electrically connected to the conductive island(s). In some embodiments, the bond pad structure includes a second bus (e.g., a power-supply bus or a signal bus) that comprises at least a portion of the second metal layer(s). The second bus may be oriented substantially parallel (e.g., at an angle between −5° and 5°, preferably between −1° and 1° to the direction of elongation of the conductive island(s). In certain embodiments, two metal layers—lower, patterned metal layer and an upper, contiguous metal layer—are disposed above the first patterned metal layer. The structure may have second and third buses, the second bus including at least a portion of the lower, patterned metal layer and the third bus including at least a portion of the upper, contiguous metal layer. The bond pad structure may also include a top metal layer disposed above the second metal layer(s) and having a bonding area for bonding to a wire.

In some embodiments, the planar over-voltage clamp devices are mirror symmetric about an axis in the direction of elongation of the conductive islands. Further, in certain embodiments, the substrate includes an even number of planar over-voltage clamp devices. The clamp devices may be or include bipolar junction transistors. Alternatively or additionally, the clamp devices may include MOS structures. In certain embodiments, the clamp devices include MOS structures, each having (i) in the high-side region, a lightly doped first deep region of a first conductivity type; (ii) in the low-side region, on opposite sides of and adjacent the first deep region, lightly doped second deep regions of a second conductivity type; (iii) formed in the first deep region, a highly doped first shallow drain region of the first conductivity type and, on opposite sides of the first shallow region, highly doped second shallow regions of the second conductivity type; and (iv) formed in each of the second deep regions, a highly doped third shallow source region of the first conductivity type. The first, second, and third shallow regions are elongated in the same direction as the conductive islands. The second shallow regions and, optionally, the first shallow regions may be electrically connected to the conductive island(s). Further, the third shallow regions may be electrically connected to the conductive area surrounding the conductive islands. Collectively, the second shallow regions, the first and second deep regions, and the third shallow regions may have a thyristor-type response.

The planar MOS clamp devices may further include highly doped fourth shallow regions formed in the second deep regions, the third shallow source regions being located between the second and the fourth shallow regions. The fourth shallow regions may also be electrically connected to the conductive area surrounding the conductive island(s). The MOS structures may also include gate structures, each having an insulating layer and a gate electrode disposed on the insulating layer. At least portions of the gate structures overlap the second deep regions. In some embodiments, the MOS structures further include isolating barriers.

In a second aspect, a bond pad structure in accordance with various embodiments includes (a) a substrate having a plurality of planar MOS structures operative as voltage clamps integrated therein, and (b) a first metal layer with one or more conductive islands disposed above the substrate. Each MOS voltage clamp includes (i) a gate structure; (ii) a first highly doped region of a first conductivity type on one side of the gate structure; and (iii) a second highly doped region of the first conductivity type on a second side of the gate structure. The second highly doped region is separated from the gate structure by a third highly doped region of a second conductivity type and by spacing and/or ballasting. The conductive island(s) is (are) electrically connected to the second (and, optionally, the third) highly doped regions, and a conductive area surrounding the conductive island(s) is electrically connected to the first highly doped regions.

The bond pad structure may include one or more second metal layers disposed above the first metal layer and electrically connected to the conductive island(s), and may further have a top metal layer disposed above and electrically connected to the second metal layer(s). The conductive island(s) and the doped regions of the planar MOS structures may be elongated in a first direction, and the bond pad structure may include a power-return bus oriented substantially perpendicular to the first direction. The power return bus may include at least a portion of the conductive area surrounding the conductive island(s). The planar MOS structures may be configured to shunt currents, under over-voltage conditions, from the conductive island(s) to the power-return bus.

BRIEF DESCRIPTION OF THE DRAWINGS

The foregoing discussion will be understood more readily from the following detailed description of the invention when taken in conjunction with the accompanying drawings, in which:

FIG. 2A graphically illustrates the current-voltage characteristics of the embodiment illustrated in FIG. 1A under transmission-line-pulse (TLP) testing;

FIG. 2B graphically illustrates the current-voltage characteristics of a prior-art clamp structure under TLP testing;

FIG. 7 is an exemplary sectional diagram of a bond pad structure with integrated clamp devices in accordance with various embodiments;

DETAILED DESCRIPTION

Figure 1A:
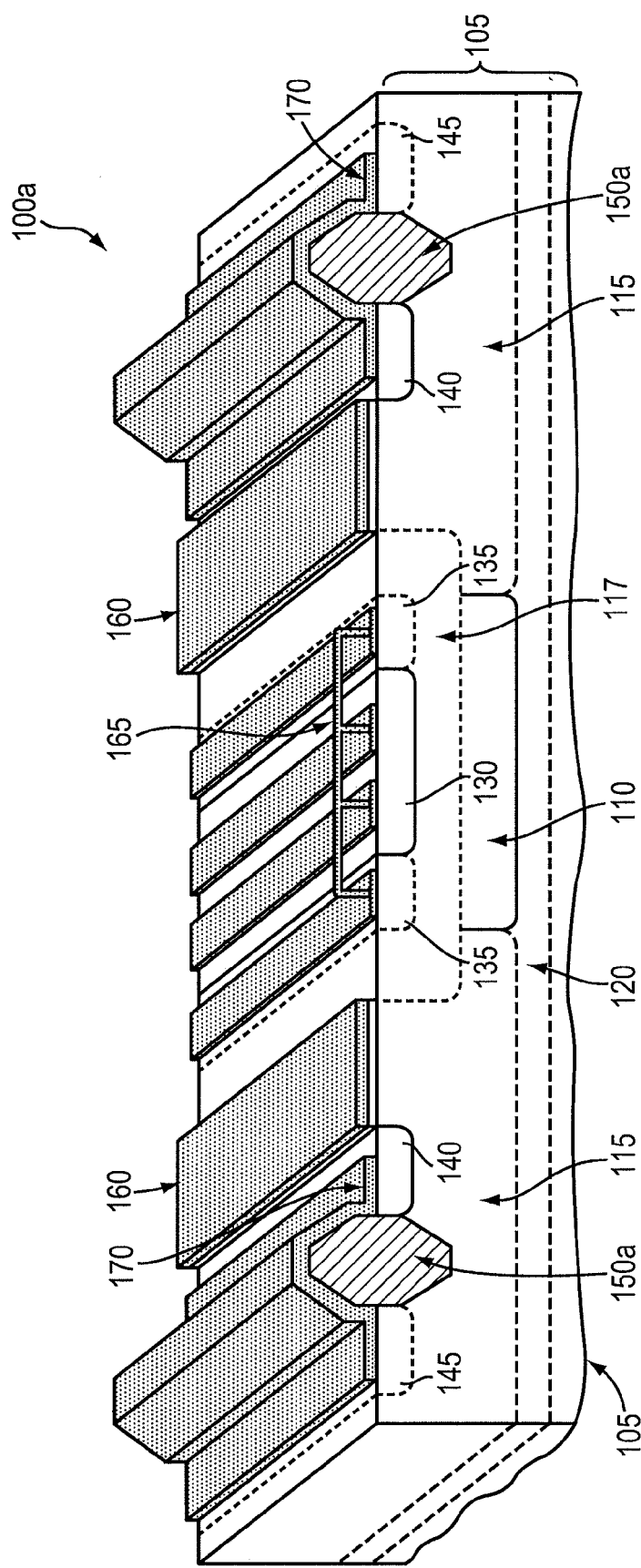
FIGS. 1A-1C are schematic perspective diagrams of topologically symmetric clamp structures in accordance with various embodiments of the invention.
Figure 1B:
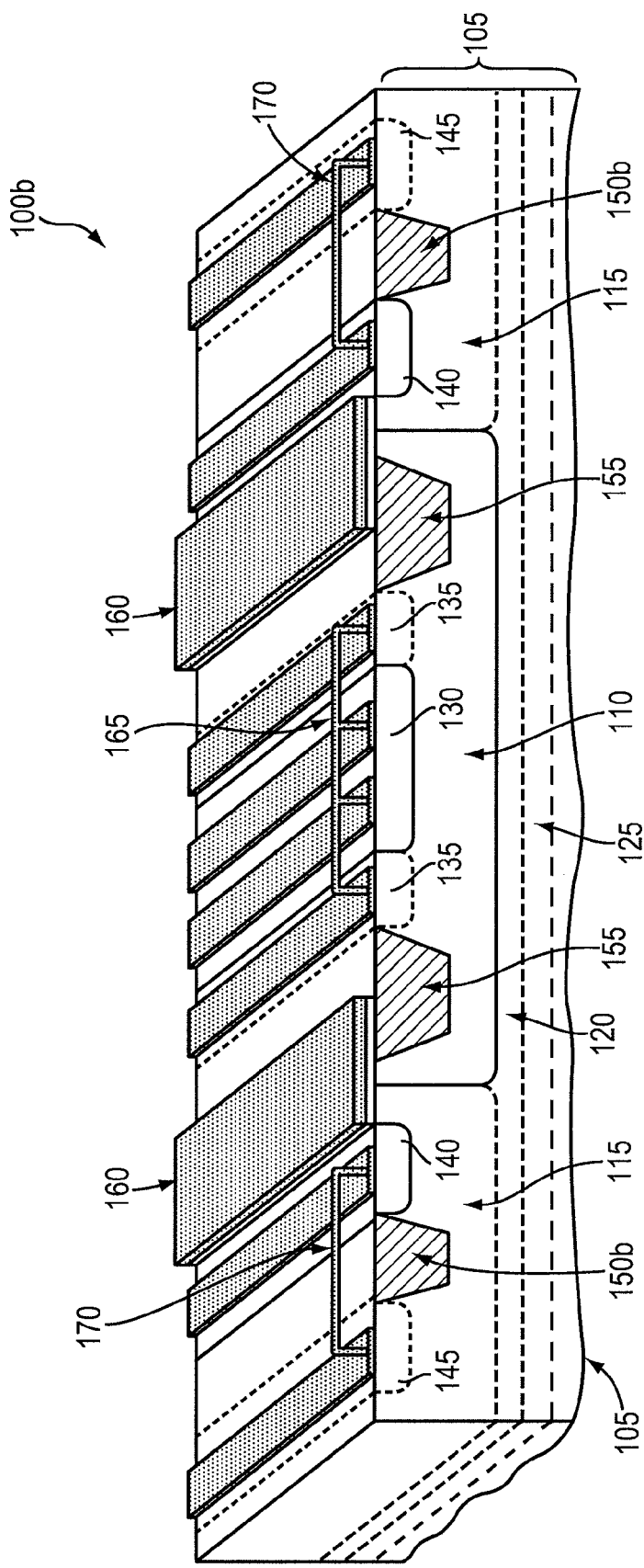
Figure 1C:
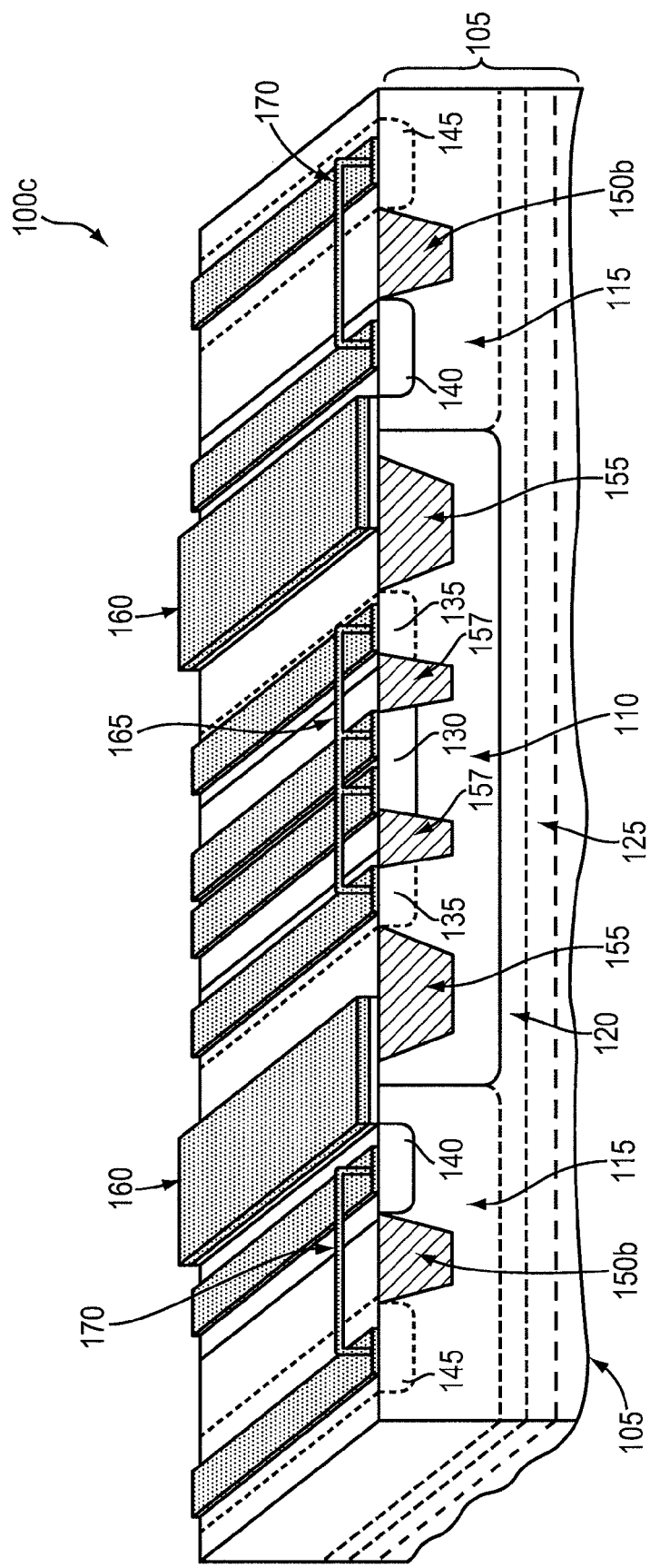

The present invention provides, in various embodiments, transient over-voltage clamp devices with improved protection characteristics. FIGS. 1A-1C illustrate exemplary planar MOS embodiments 100a, 100b, and 100c. These and other embodiments of the invention can be produced using standard semiconductor device fabrication techniques, including silicon epitaxy, layer deposition and patterning, doping by ion implantation or diffusion, and subsequent metal interconnecting.

Each of the exemplary structures 100a, 100b, 100c comprises a semiconductor substrate 105 (e.g., silicon) and, embedded therein, doped deep-well regions 110, 115 of alternating conductivity types. For example, a central well 110 may be doped with a negative dopant (e.g., group V atoms such as phosphorus or arsenic), and the adjacent wells 115 to both sides may, accordingly, be doped with a positive dopant (e.g., group III atoms such as boron). Between the deep-well regions 110, 115, a metallurgical junction forms, which blocks currents during normal operation, i.e., at voltages below breakdown conditions.

In certain embodiments, illustrated in FIG. 1A, a double-diffused region 117 may further be formed primarily in the central well 110 and reaching into the adjacent wells 115. This double-diffused region 117 is of the same conductivity type as the central well 110, and has a higher dopant concentration. In some embodiments, the deep-well regions 110, 115 may be butted, or formed at a certain distance from each other, to adjust the conductive characteristic of the structure in response to over-voltage conditions. Underneath the deep-well regions 110, 115, an isolating implant layer 120 may be formed in the substrate 105. Additionally, an epitaxial layer 125 may be formed underneath the isolating implant, as shown in FIGS. 1B and 1C. The substrate 105 typically has high sheet resistance. It may be lightly doped with a dopant of positive or negative conductivity type. In some embodiments, the optional isolating and/or epitaxial layers 120, 125 are of the opposite conductivity type than the substrate. In alternative embodiments, the epitaxial layer and the substrate are of the same conductivity type. The substrate properties may be selected so as to optimize the MOS device vertical conduction properties and trigger voltage.

Figure 1D:
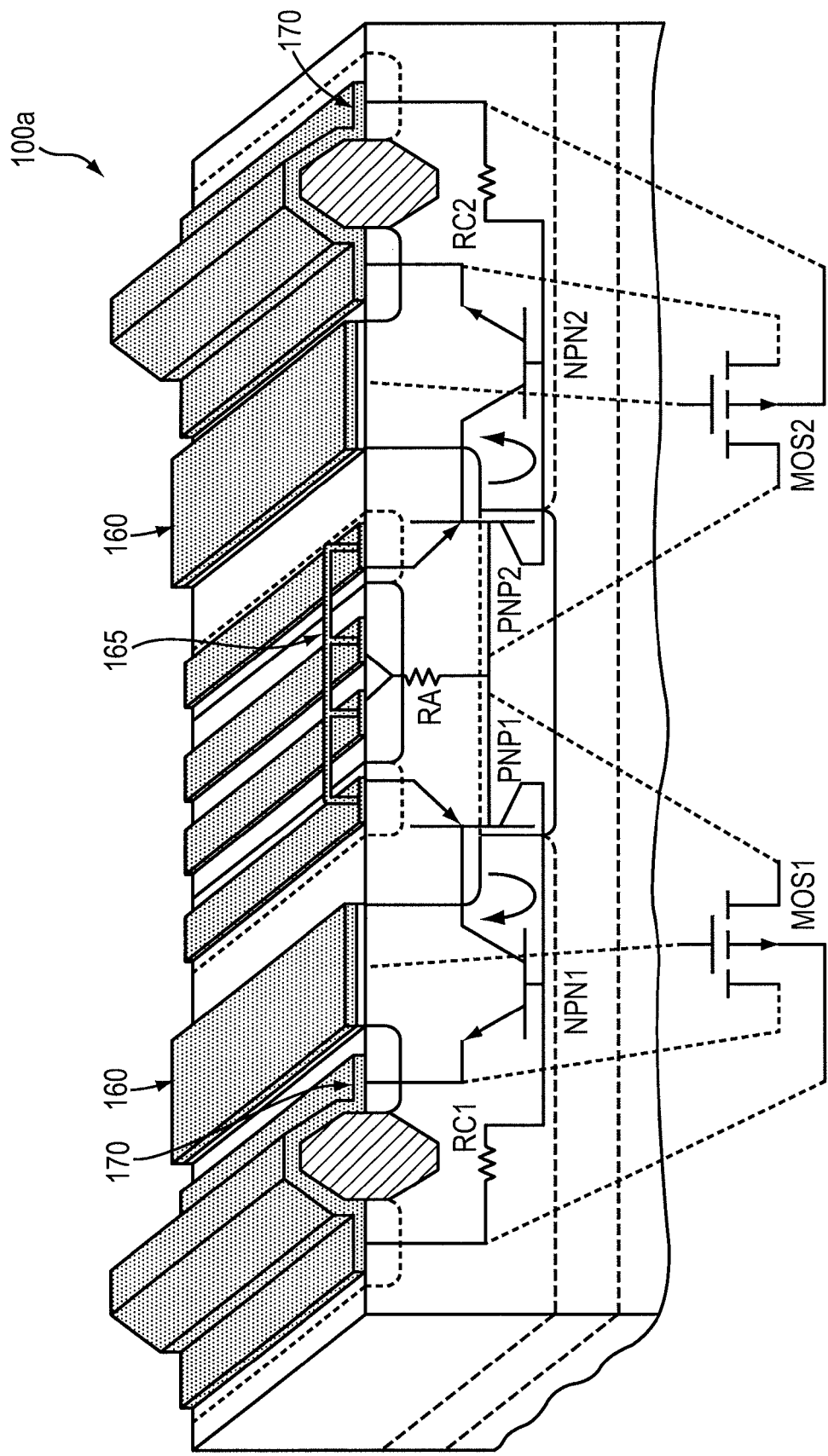
FIG. 1D is a schematic perspective diagram of the embodiment of FIG. 1A, further illustrating the equivalent electronic components inherent in the clamp structure.

The MOS structures 100a, 100b, 100c further include highly-doped shallow regions formed in the deep-well regions 110, 115, whose dopant concentration is comparatively lower. For ease of reference, well region 110 will, in the following discussion, have a negative conductivity type and be referred to as the n-well, and the adjacent well regions 115 will be referred to as p-wells. It should be noted, however, that the scope of the invention also includes embodiments wherein positive and negative dopants are exchanged in all the doped regions, i.e., where regions herein referred to as n-doped are p-doped and vice versa. In the n-well 110, a negatively doped ("$n^+$") shallow region 130, and surrounding positively doped ("$p^+$") shallow regions 135 are formed. The p-wells 115 include negatively doped ("$n^+$") shallow regions 140. Collectively, the $p^+$-region 135, n-well 110, p-well 115, and $n^+$-region 140 provide a thyristor-type conductivity modulation that serves to block currents at operating voltages, and to shunt currents at excess voltages, i.e., at voltages beyond a predetermined trigger voltage. The $p^+$-regions 135 inject hole majority carriers that help abruptly drop the holding voltage after the trigger voltage is reached, thereby avoiding heat-induced failure, and improving the over-voltage stress handling capability of the device. The $n^+$-region and $p^+$-regions 130, 135 may be abutted (as shown in FIG. 1A), or spaced apart (see, e.g., FIG. 1C). FIG. 1D shows a schematic representation of equivalent parasitic components inherent in MOS structure 100a. The deep-well ballast resistance RA depends on the spacing between the highly doped regions 130, 135, and the contact resistance between these regions and the terminal 165. Adding spacing between regions 130, 135 results in a higher ballast resistance RA, which, in turn, implies higher base resistance in the parasitic bipolar transistors PNP1, PNP2, as well as higher drain resistance in the planar MOS formations MOS1, MOS2. The spacing may be defined to achieve a combination of high over-voltage clamping robustness and low leakage current.

Typically, but not necessarily, the p-wells 115 further include shallow $p^+$-regions 145. These regions 145 may be separated from the $n^+$-regions 140 by ballasting oxide, which may be implemented, for example, by local oxidation of silicon (LOCOS), as shown in FIG. 1A, or by shallow trench isolation (STI), as illustrated in FIGS. 1B and 1C. Separating the $n^+$- and $p^+$-regions 140, 145 in this way serves to increase the resistance in the parasitic bipolar junction transistors NPN1, NPN2 that are formed by the $n^+$-regions 140 (emitter), the p-wells 115 (base), and the n-well 110 (collector), as indicated in FIG. 1D. An increased base resistance, in turn, aids in building the base voltage required to quickly turn on the parasitic transistors NPN1, NPN2 during a transient overvoltage, i.e., to cause snapback onset.

In some embodiments, ballasting may also be added to the n-well 110. For example, embodiment 100b, shown in FIG. 1B, includes STI trenches 155 that separate the $p^+$-region 135 from the junction between the n-well 110 and the p-well 115; and embodiment 100c, shown in FIG. 1C, includes STI trenches 157 between the $n^+$-region 130 and the $p^+$-regions 135. The inter-well isolations 157 in the first terminal may contribute to an increased base resistance RA of the parasitic PNP bipolars (indicated in FIG. 1D), and reduce the leakage current. Moreover, they may cause a more uniform current distribution in the on-state of the clamp structure, diverting currents into deeper regions of the silicon substrate, and away from the surface.

The structures further include MOS gates 160 disposed on the substrate 105, in regions that overlap the p-wells 115 and, in some embodiments, also the n-well 110 (see FIGS. 1B and 1C). The MOS gate may include an oxide or other isolating layer with high dielectric constant, and a polysilicon or metallic contact layer thereover. If polysilicon is used, it may be positively or negatively doped at a high concentration. The shallow regions 130, 135 in the n-well 110 may be electrically connected to each other and to a first terminal 165 by a conductive material such as, e.g., silicide, aluminum, or copper. The shallow regions 140, 145 in the p-wells 115 may likewise be shorted together, and are connected to a second terminal 170. The first terminal 165 may act as the drain, and the second terminal 170 as the source, or vice versa. In alternative embodiments, the shallow regions 130, 135, 140, 145 may be connected to separate terminals constituting individual device control pins. Adding trench isolation 155 between the MOS gate 170 and the first terminal 165, as in clamp embodiments 100b, 100c, may increase the operating voltage between gate 170 and terminal 165 that the clamp can safely sustain.

The performance of fast over-voltage-protection devices can be characterized by TLP (transmission-line-pulse) testing. Therein, high-current pulses are applied to a device under test (DUT) at successively higher levels through a transmission line (e.g., a coaxial cable) of specified length. The pulses are of a current amplitude and duration representative of the "human body model" (HBM). Quasi-static device voltage and current are measured during the substantially flat top of each pulse to develop a TLP current-voltage (I-V) curve for the device. Further, potential damage may be assessed by measuring the leak current at the operating voltage following each test pulse.

FIG. 2A illustrates the I-V characteristic of a clamp structure 100a in response to TLP testing. The clamp measures 42 μm by 58 μm, and is designed for use at, typically, 15 V operating voltage and at room temperature. The 100-ns TL pulses have been defined in this measurement for a current limit of 3 A, equivalent to over 4 kV HBM. The clamp triggers at a voltage of about 25 V, and drops to a holding voltage of about 2.5 V, which increases with subsequent test pulses. During normal operating conditions, the clamp is stable and does not affect the circuit functionality. The wide gap between the operating voltage and the trigger voltage serves to avoid false triggering of the clamp. The leak current, tested at 15 V, is stable at less than 3 nA for TLP currents up to 3 A. Thus, this clamp embodiment may sustain elevated ESD stress conditions and safely protect high voltage inputs and outputs. It has a small foot print, and a relatively low leakage current that results in high energy efficiency.

Figure 2C:
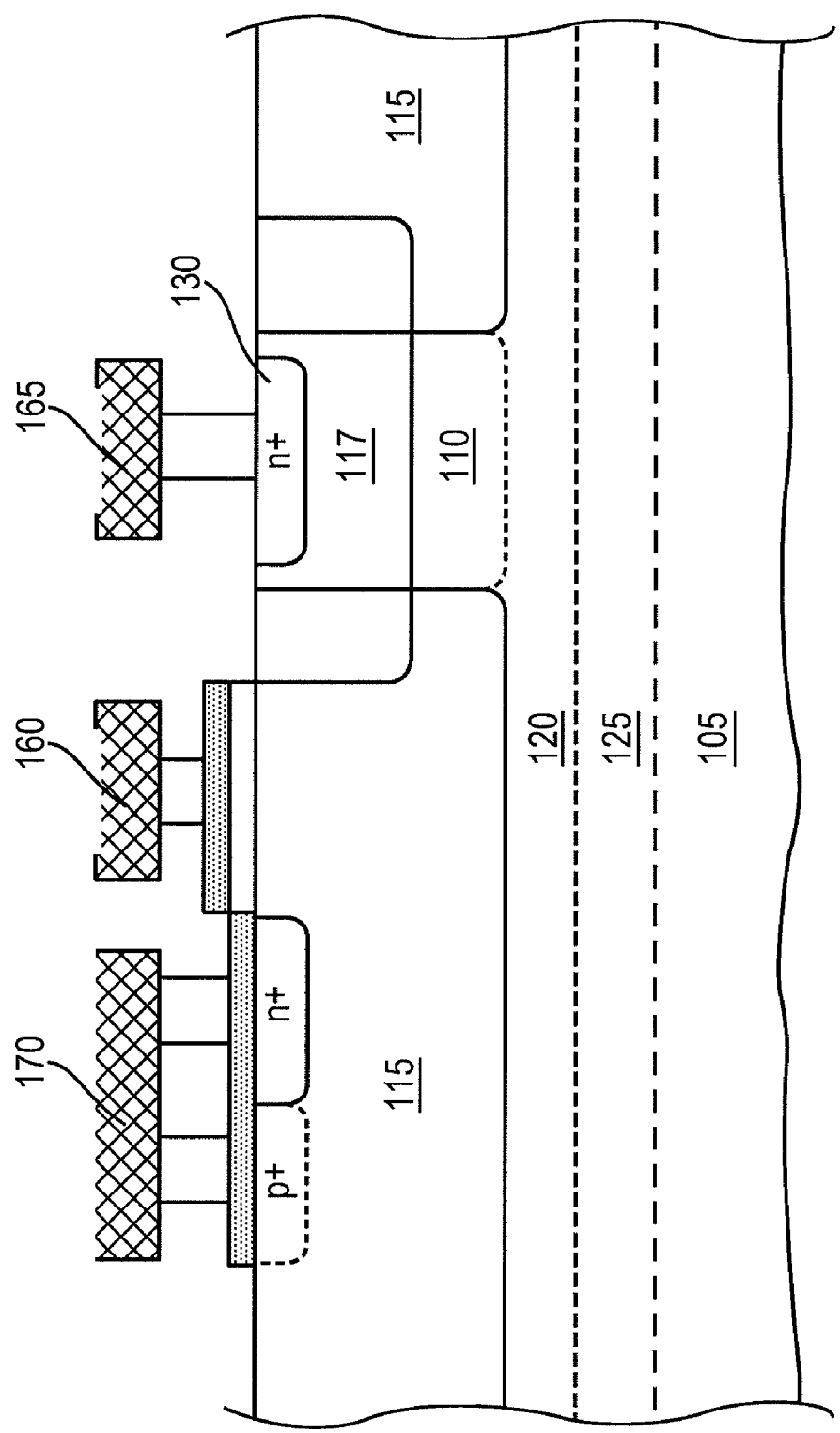
FIG. 2C is a schematic perspective diagram of the prior-art clamp structure whose current-voltage characteristic is shown in FIG. 2B.

For comparison, the TLP I-V characteristic of a prior-art standard MOS clamp device that has optimized drain-gate spacing, but is lacking the complementary shallow well regions 135 adjacent the gate and adequate ballasting, is shown in FIG. 2B. The prior-art device itself is illustrated in FIG. 2C. This clamp measures 200 mm by 200 mm, and is tested using the same TLP parameters as described with respect to FIG. 2A. At a trigger voltage of about 26 V, snapback to a holding voltage of about 6 V (corresponding to a current of 0.5 A) occurs; this holding voltage is significantly larger than for the clamp structure 100a. The leakage current increases slightly immediately after snapback, indicating a soft failure. After soft failure, the I-V curve cannot be reproduced in the same way, which poses long-term reliability problems in the device. Further, power consumption of the system drastically increases over time, as is typical in certain electronic systems that heat up during usage over time. At 1 A, the device fails completely, as evidenced by the sudden spike in the leakage current. Due to the soft failure following snapback, this device is not reliable as a voltage clamp. In particular, it is not a viable solution for zero-defect IC applications.

Various clamp embodiments according to the invention are also advantageous in that their trigger voltages do not shift significantly with varying time characteristics of the input signal. For example, TLP testing of clamp embodiment 100a revealed that the trigger voltage shifts only from about 25 V to about 20 V when the pulse rise time is varied between 10 ns and 200 ps. In each case, the trigger voltage is significantly above the operating voltage (15 V), which ensures that the clamp is not activated under normal operation conditions.

Figure 3A:
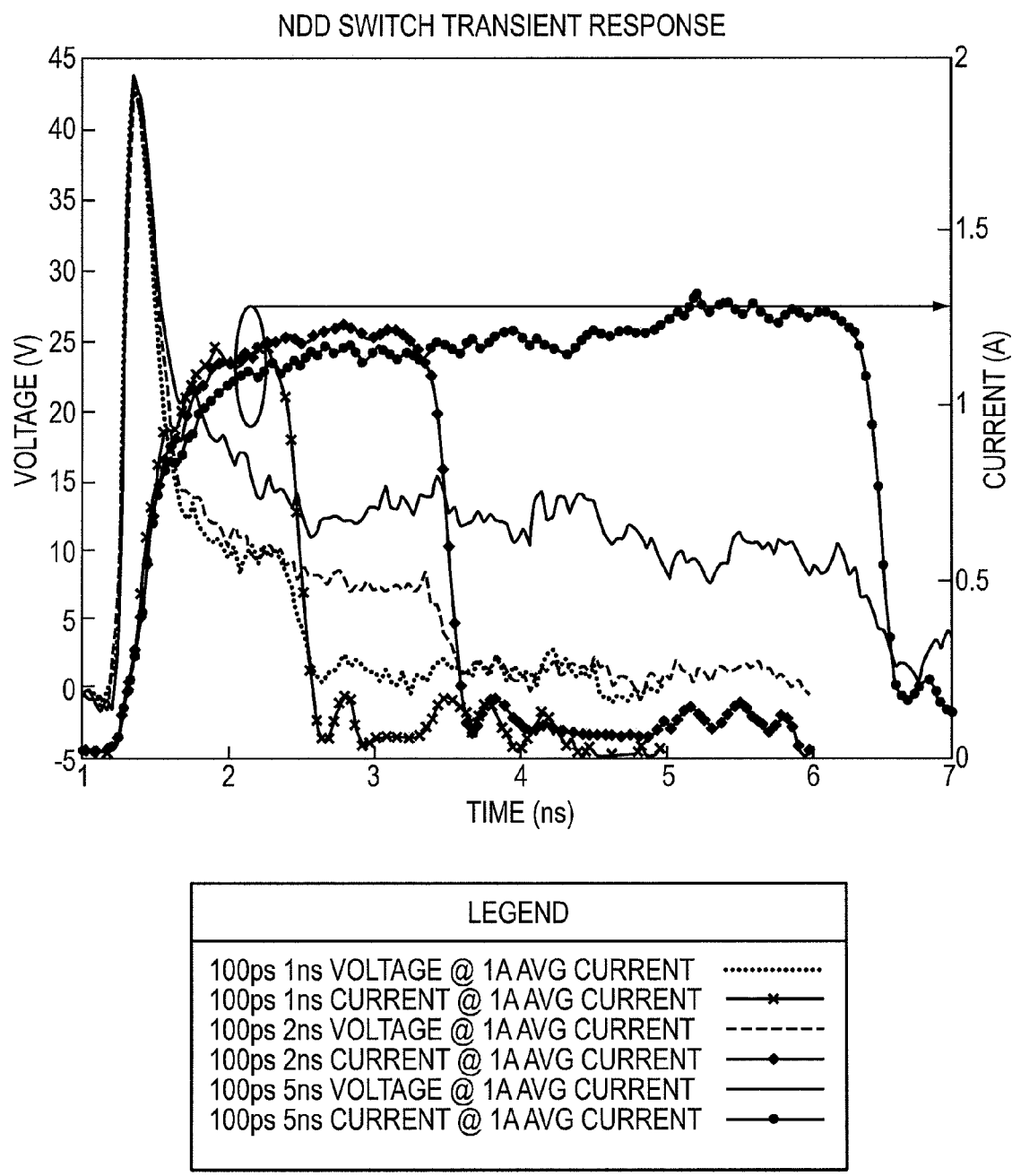
FIG. 3A graphically illustrates the fast transient current and voltage characteristics of the embodiment illustrated in FIG. 1A for various pulse widths.

The ability of a voltage clamp to effectively protect an IC circuit from ESD stress conditions further depends on the switching speed of the clamp. Many slow clamp devices which sustain ESD stresses satisfactorily do nevertheless not protect the circuits because they do not turn on fast enough. Embodiments of the present invention may undergo full conductivity modulation—from blocking behavior to full current conduction through the device—within a few nanoseconds. This time-scale is generally short enough to protect the IC. FIG. 3A illustrates the transient over-voltages and currents for clamp embodiment 100a as a function of time for 75-V pulses with widths of 1.2 ns, 2 ns and 5 ns and a rise time of 100 ps. For all pulse widths, the response time is less than 2 ns. The first voltage impulse (i.e., the voltage overshoot) does not exceed 45 V. Once the device has triggered, the holding voltage is initially high, guarantee that not latching condition is obtained, and drops over time as the clamp is continuingly subject to high stress. This behavior drastically expands the robustness of the clamp, and makes it highly reliable for switching applications.

Figure 3B:
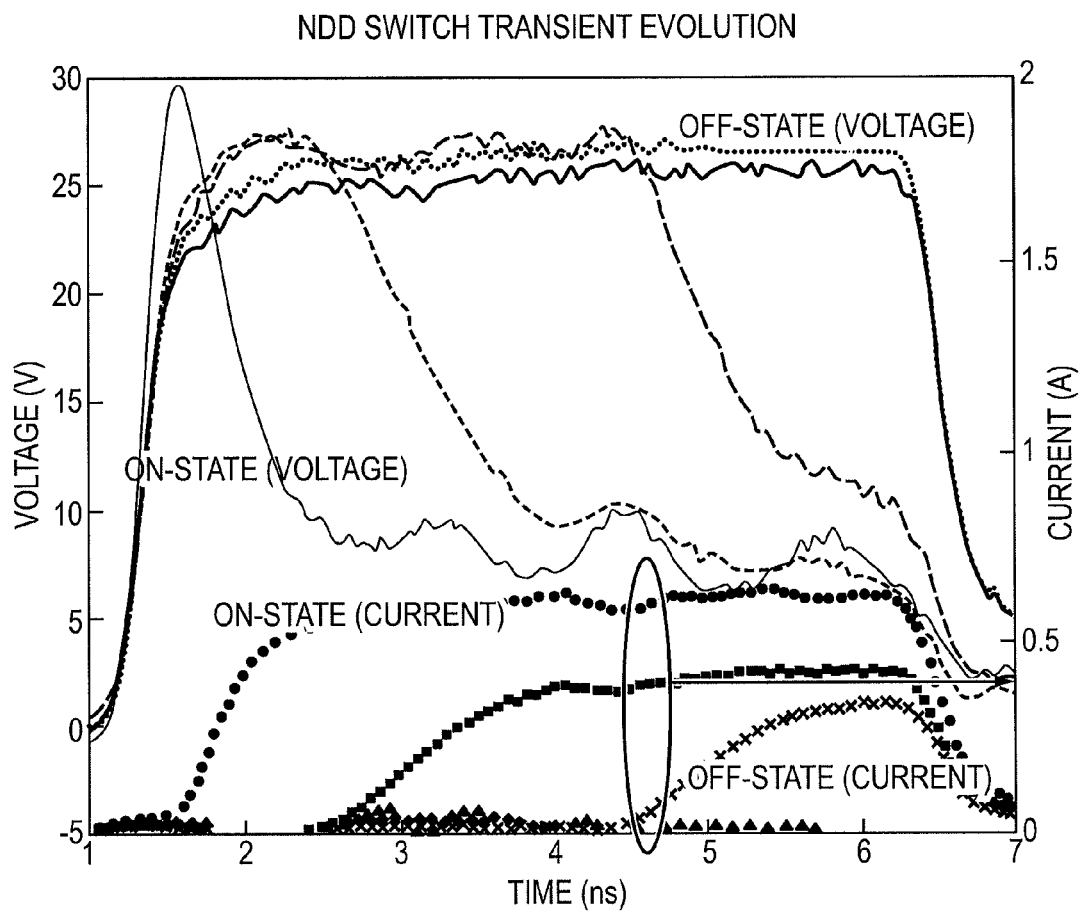
FIG. 3B graphically illustrates the transient current and voltage characteristics of the embodiment illustrated in FIG. 1A near the trigger point for various pulse voltages.

FIG. 3B shows the current and voltage response of clamp embodiment 100a for various pulse voltages close to the trigger point, i.e., V1=26 V (off), V2=27 V (off), V3=28 V (start turn-on), V4=29 (faster turn-on in response to higher pulse), and V5=40 V (full turn-on), illustrating the stability of the device in that regime. Just below the trigger point, the clamp device remains in the off-state, i.e., does not conduct any substantial currents. At a slightly higher pulse voltage of about 28 V, the clamp initially sustains that voltage, but turns on after about 4.5 ns, dropping to a lower holding voltage and conducting current. At increasingly higher pulse voltages, the turn-on point shifts in time towards the onset of the TL pulse, and the response characteristics increasingly resemble those shown in FIG. 3A.

Figure 4A:
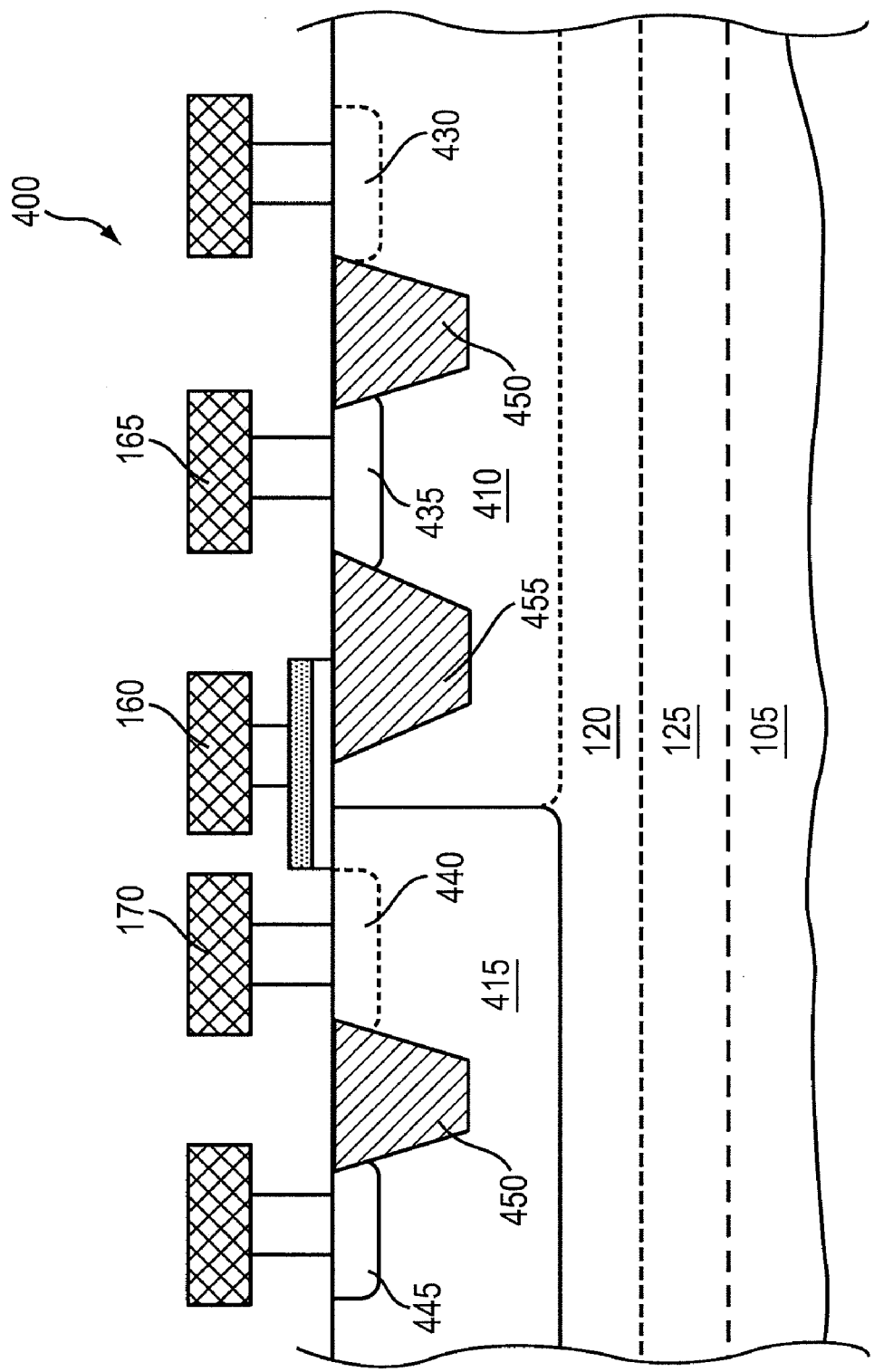
FIG. 4A is an exemplary sectional diagram of a topologically asymmetric clamp structure in accordance with one embodiment of the invention.

Various functionally advantageous structural features of the embodiments described above may also be implemented in modified clamp embodiments. For example, while topologically symmetric clamp embodiments, such as those illustrated in FIGS. 1A-1C, may have particularly advantageous ESD protection characteristics, the invention is not limited to this preferred embodiment. FIG. 4A illustrates an embodiment 400 including only one n-well 410 and one p-well 415. Highly doped n⁺- and p⁺-regions 430, 435 are implanted in the n-well 410, and, similarly, highly doped n⁺- and p⁺-regions 440, 445 are implanted in the p-well 415. Isolating regions 450, 457 are formed between the highly doped regions 440, 445 and 430, 435 of opposite conductivity types in the n-well 410 and p-well 415, respectively. Further, an isolating region 455 is formed in the deep wells 410 between the p⁺-region 435 and the gate structure 160.

Figure 4B:
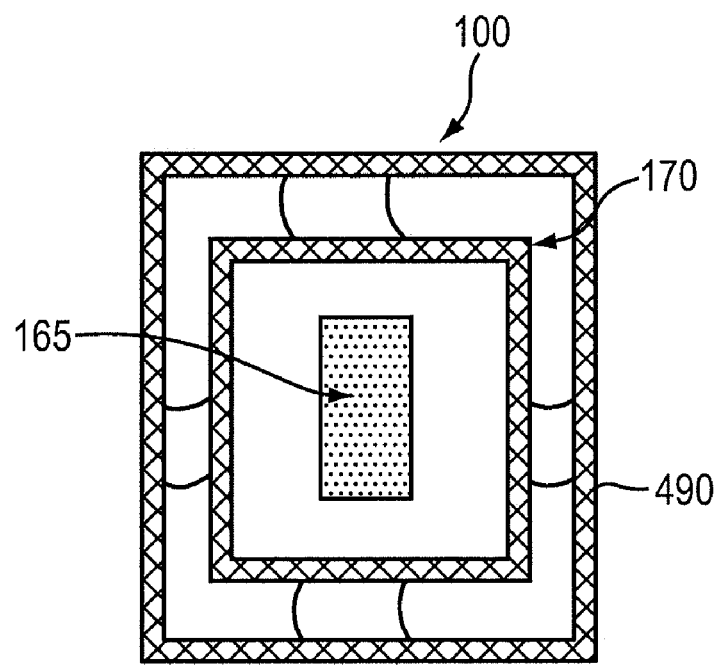
FIG. 4B is a schematic top view of a topologically symmetric clamp structure in accordance with some embodiments.
Figure 4C:
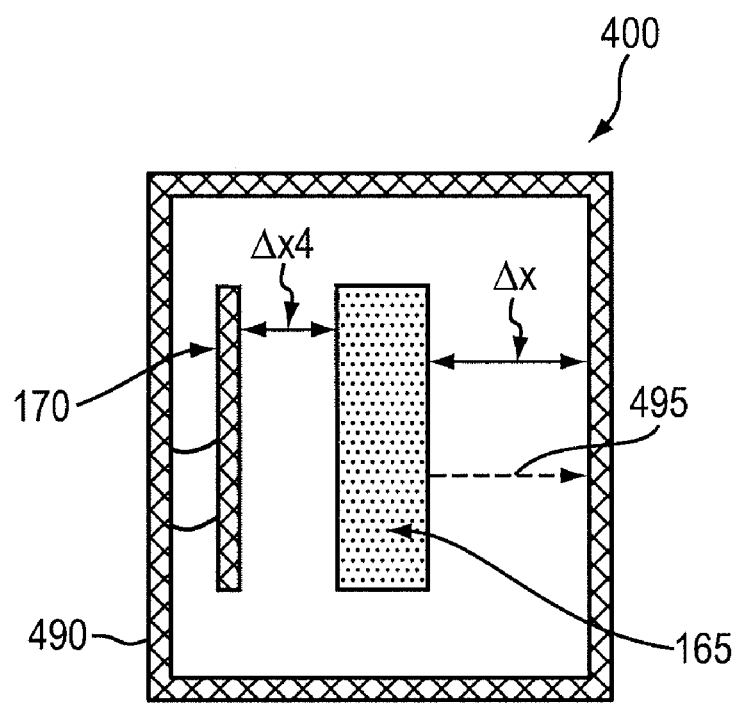
FIG. 4C is a schematic top view of a topologically asymmetric clamp structure in accordance with some embodiments.

FIGS. 4B and 4C are top views of topologically (and, as shown, also geometrically) symmetric and asymmetric clamp implementations, respectively. Both implementations include an outer ring 490, which serves to isolate the electronic components in its interior region from the surrounding circuitry. This outer ring 490 is electrically connected to the second terminal 170 of the respective clamp structure. In the symmetric clamp embodiment 100, shown in FIG. 4B, the second terminal 170 forms a ring around the first terminal 165 in the center of the structure, effectively shielding the first terminal 165 from the outer ring 490. In this configuration, the conduction from the first terminal 165 to the second terminal 170 occurs without risk of activating an undesirable parasitic current path. By contrast, in the asymmetric embodiment 400, shown in FIG. 4C, a conduction path 495 exists between the outer ring 490 and the first terminal 165, which is separated from the outer ring by the second terminal 170 on one side only. To avoid breakdown along this conduction path 490 during turn-on of the device, the spacing Δx between the first terminal 165 and outer ring 490 needs to have a certain minimum length, which may be over 10 microns for high-voltage processes. Further, compared to the symmetric embodiment, sizing of an asymmetric device may need to be adjusted to compensate for the lack of the radial current path between the first and second terminals 165, 170, and sustain the stress level via one-side conduction.

Figure 5A:
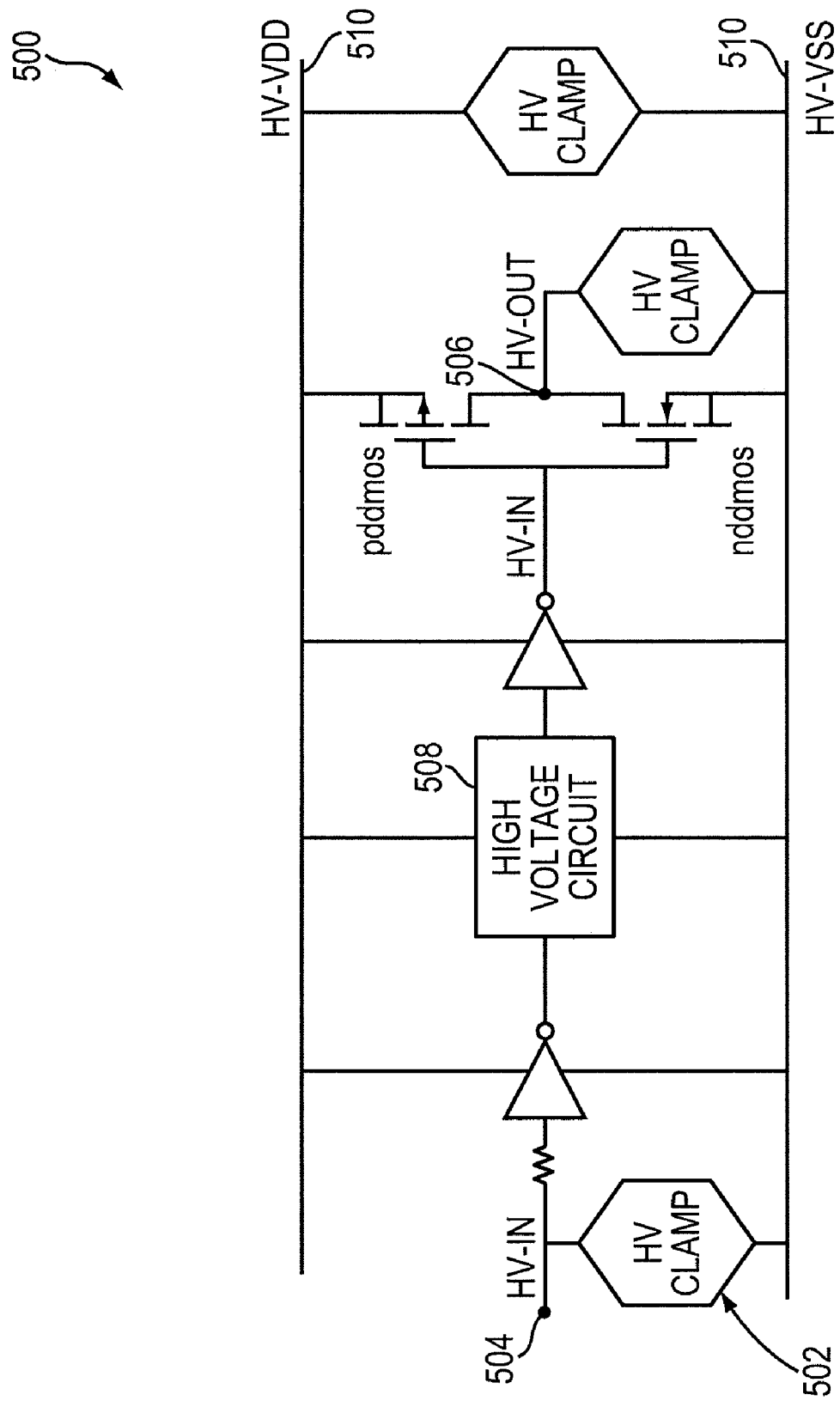
FIGS. 5A-5D are circuit diagrams illustrating applications of over-voltage clamps in accordance with various embodiments of the invention.
Figure 5B:
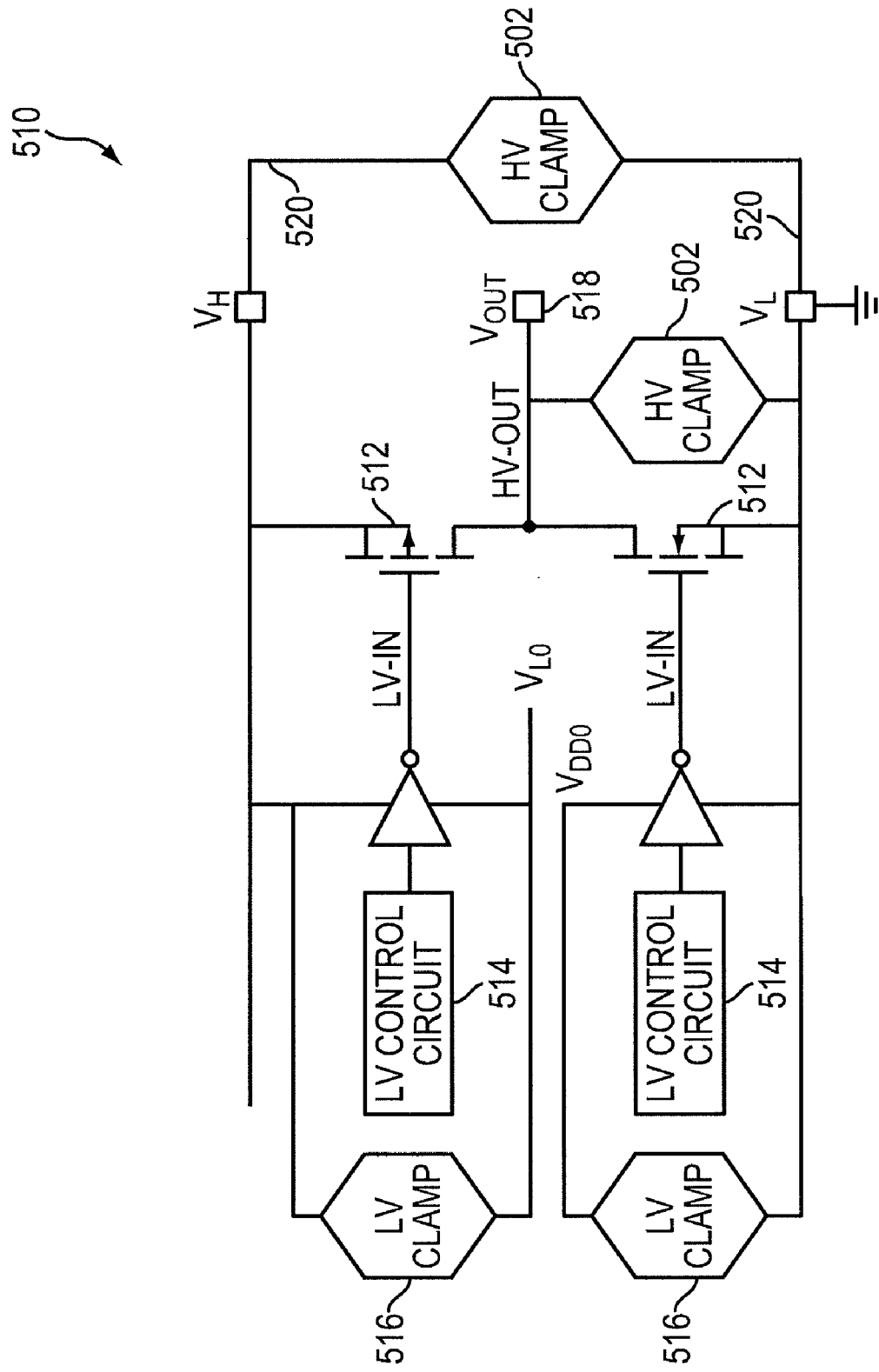

Transient over-voltage clamps according to various embodiments may be used in high-voltage double-diffused and bipolar/CMOS/DMOS integrated circuit applications, such as, for example, mixed-signal high-voltage analog circuits for imaging, medical, and industrial systems. The circuit diagrams of FIGS. 5A-5D illustrate how the clamps may be incorporated into various electronic circuits and components of systems-on-a-chip. In the circuit 500 shown in FIG. 5A, ESD protection clamps 502 are used at the input 504 and output 506 of a high-voltage internal circuit 508, as well as between the power rails 510. FIG. 5B illustrates a circuit 510 including high-voltage MOSFETS 512 that are controlled by low-voltage control CMOS/BiCMOS circuits 514. Here, conventional lower-voltage clamps 516 are incorporated to protect the control circuits 514, whereas high-voltage clamp embodiments 502 provide ESD protection at the output 518 and between the power rails 520.

Figure 5C:
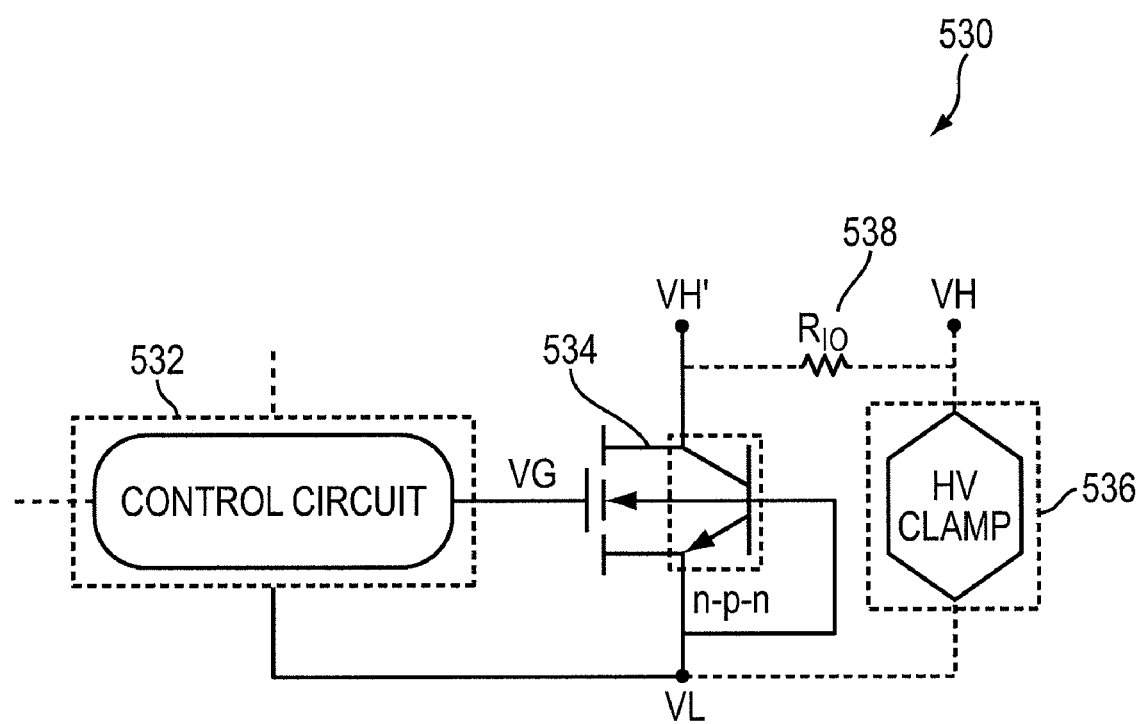

FIG. 5C illustrates a circuit 530 with a low-voltage or high-voltage input control circuit 532, and a high-voltage n-type output driver 534 in parallel with over-voltage protection. The over-voltage protection clamp 536 in conjunction with the input-output resistor 538 ($R_{IO}$)) reduces the effective current going through the high-voltage output driver 534 during very fast transients. Due to the fast response of clamp structures in accordance with various embodiments, reliable protection of very sensitive high voltage MOSFET/DDMOS/DMOS devices may be achieved even if the resistance of the input-output resistor is limited to values below 50Ω, as necessary for a variety of IC applications.

Figure 5D:
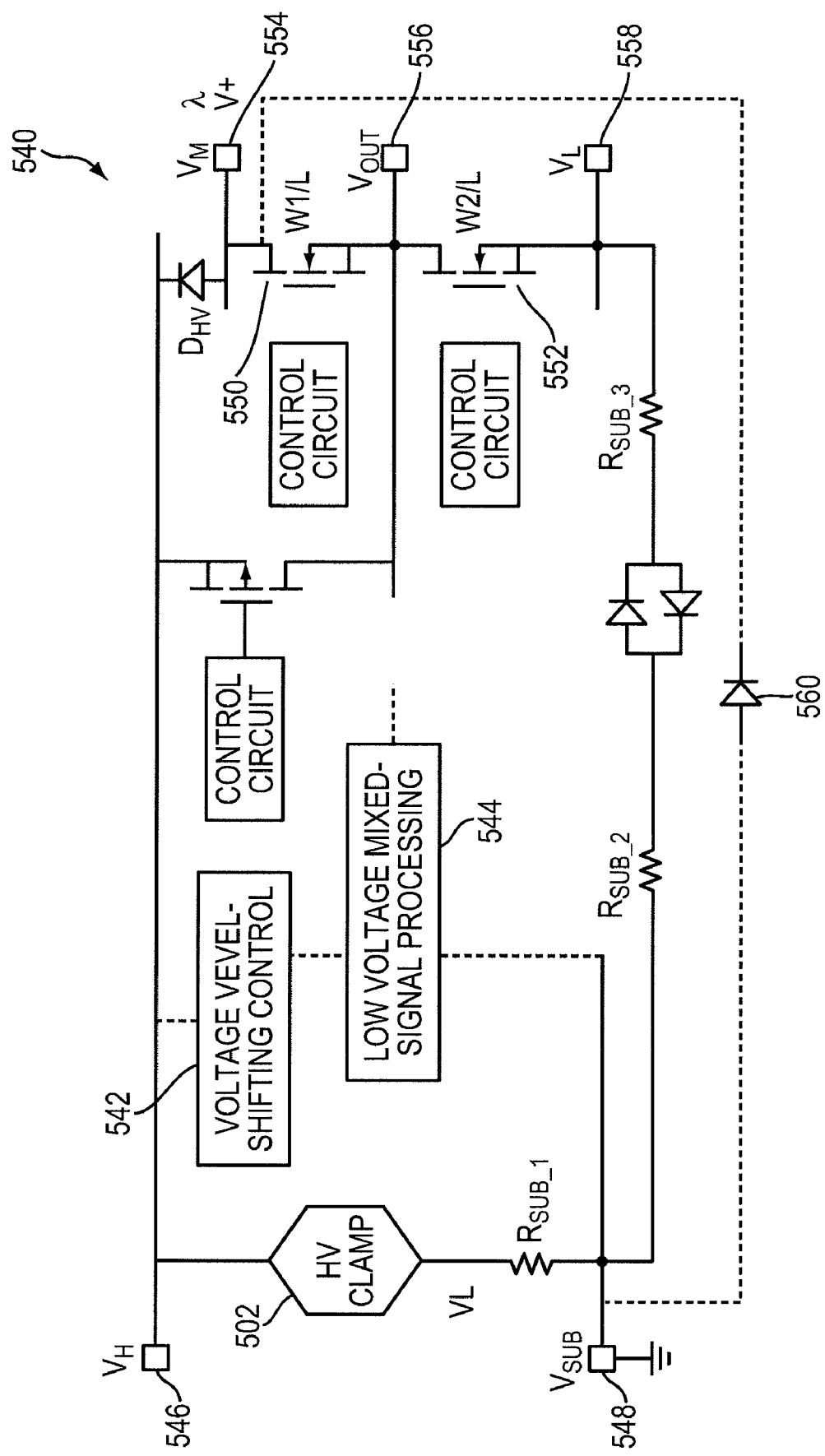

FIG. 5D illustrates an exemplary implementation of multiple high-voltage switches in a charge coupled circuit 540 for digital imaging. Herein, the over-voltage clamp 502 is connected in parallel with a high-voltage driver 542 and a low-voltage signal-processing circuit 544. The high voltage clamp 542 serves to maintain the voltage difference between a high-voltage terminal 546 ($V_H$) and a low-voltage terminal 548 ($V_{sub}$) in a predictable range, and to prevent destructive failure in the high-voltage switch devices 550, 552 (between terminals 554 ($V_M$) and 556 ($V_{OUT}$) and terminals 556

($V_{OUT}$) and 558 ($V_L$), respectively) due to reverse breakdown in the high-voltage isolation parasitic diode 560 (between terminals 548 ($V_M$) and 558 ($V_{sub}$) resulting from transient over-voltage stress. The switch devices 550, 552 may themselves be implemented using structures in accordance with various embodiments of this invention, resulting in gate-bias controllability during circuit operation and over-voltage clamping properties.

Figure 6:
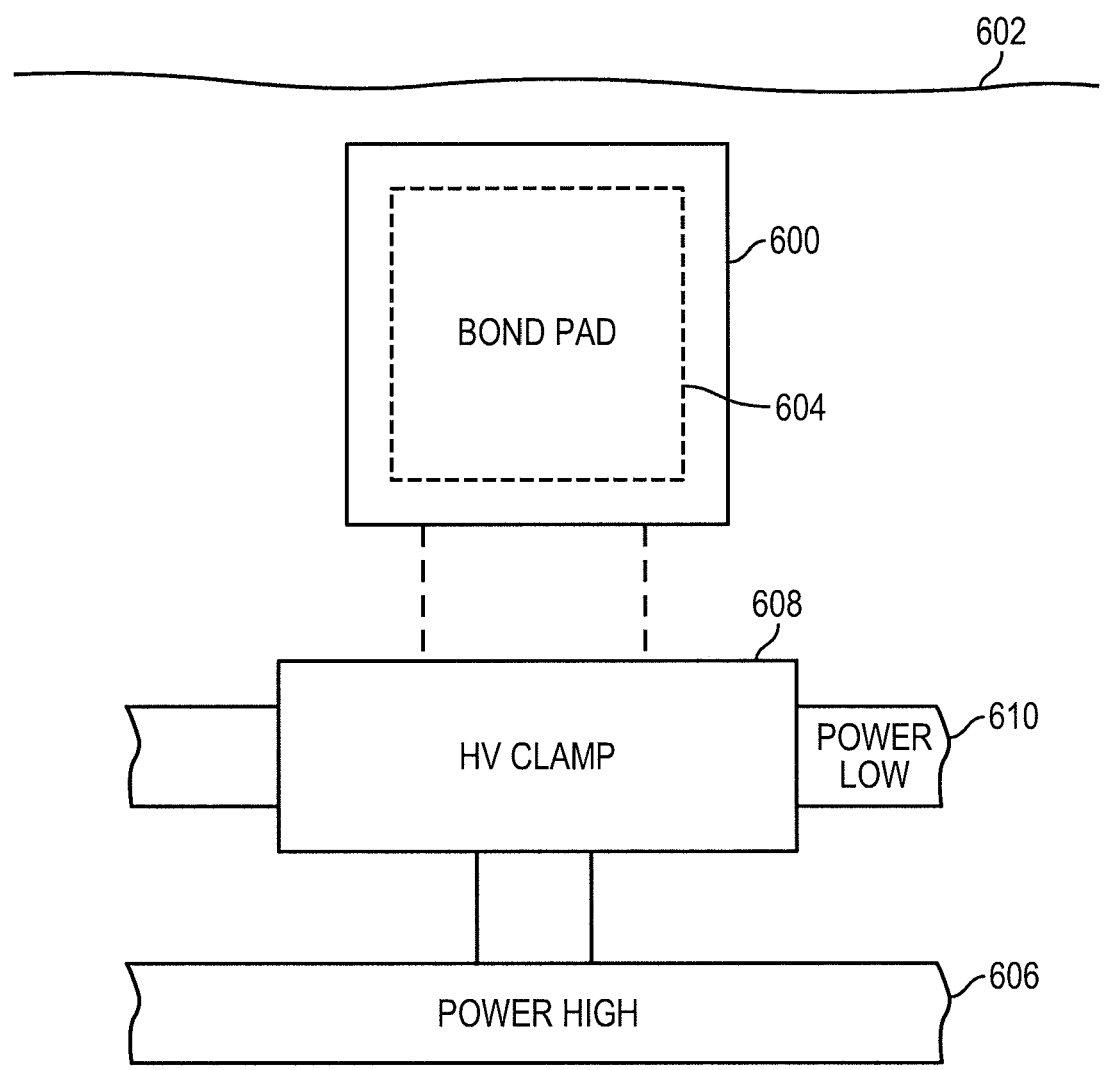
FIG. 6 is a schematic top view of a bond pad and adjacent clamp structure in accordance with some embodiments.

Voltage clamps may be implemented in ICs adjacent the bond pads, as illustrated in FIG. 6 in a schematic top view. The bond pad 600 is usually one of an array of bond pads arranged around the periphery 602 of the IC chip. Each bond pad includes a conductive area 604 for bonding a connecting wire, the other end of which is connected to a pin (e.g., an input/output or a power supply pin) of the IC package. Via the bond pad 600, a signal current or a power supply current can be provided to the IC. In the illustrated example, the bond pad 600 is connected to a power-supply bus 606 of the IC. To prevent damage to the IC under over-voltage conditions, a high-voltage clamp 608 may be located next to and electrically connected to the bond pad 600. The clamp 608 may include transistors arranged under a power-return bus 610. Excess voltages at the bond pad 600 trigger the breakdown of the transistor junctions, allowing excess currents to be shunted to the power-return bus 610.

Figure 8:
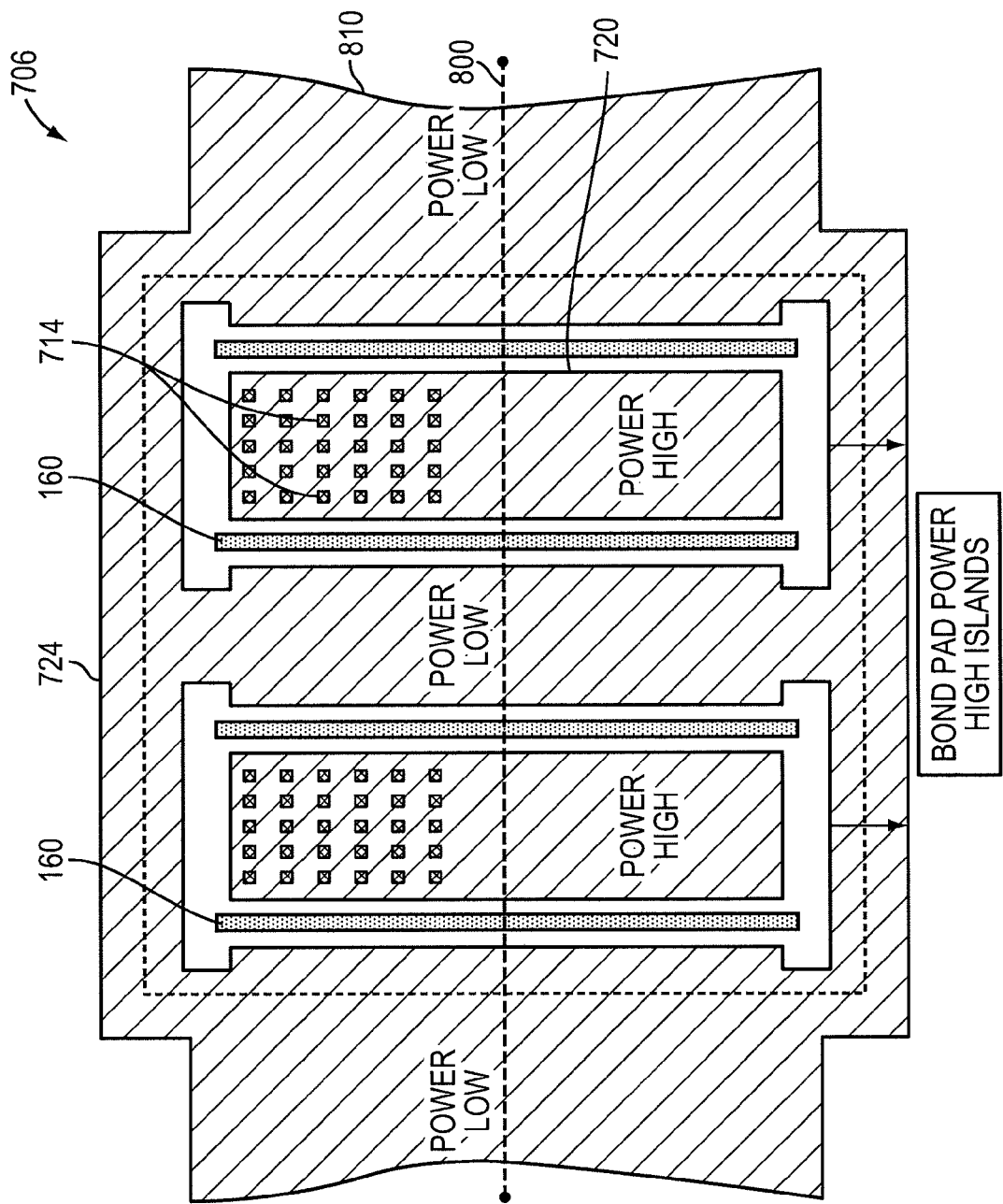
FIG. 8 is a schematic top view of a first metal layer of the bond pad structure depicted in FIG. 7 in accordance with one embodiment.

In various embodiments, overvoltage clamping functions are integrated into the bond pad. Advantageously, such an arrangement reduces the total footprint of the bond pad and ESD clamp device. An exemplary embodiment is shown in FIGS. 7 and 8. FIG. 7 illustrates the bond pad structure with ESD protection in cross section, while FIG. 8 provides a top view of the bond pad structure. The dashed line 800 in FIG. 8 indicates where the cross-section shown in FIG. 7 is taken.

Referring first to FIG. 7, the bond pad structure 700 includes several metal layers 702, 704a, 704b, 704c, 706 disposed above a semiconductor substrate 708. In the exemplary structure, five metal layers are shown; however, the number of metal layers may vary, and is generally at least two. The metal layers 702, 704, 706 are separated from one another and from the semiconductor substrate 708 by inter-level dielectric layers. Typically, the dielectric layers have thicknesses in the range from about 0.3 to about 1.0 μm, and the metal layers have thicknesses in the range from about 0.5 to about 1.0 μm. The dielectric material may be low-k dielectric (i.e., have low dielectric constants), and/or may be selected to withstand the mechanical stress during bonding and bond-pad touching processes.

The top layer 702 of the bond pad 700 is passivated along its rim 710, which surrounds a conductive bonding area 712 (equivalent to area 604 in FIG. 6). The area 712 may have dimensions of, for example, 70 μm on each side. Metallic vias 714 penetrate the dielectric layers and connect the metal layers 702, 704, 706 to each other and to the semiconductor layer 708. As shown, the vias 714 between successive pairs of layers may be laterally offset. This configuration avoids or reduces the transfer of the mechanical stress applied during bonding, thus protecting the underlying structures during the bonding process. Further, the vias 714 may be arranged in a symmetric fashion to facilitate more uniform current densities through the multi-layer structure 700.

The ESD protection is provided by MOS with embedded bipolar clamp devices fabricated in the semiconductor substrate 708 (e.g., using conventional high voltage CMOS manufacturing techniques). Generally, the clamp structure includes alternately positively and negatively doped deep wells 110, 115 and, embedded therein, alternately positively and negatively doped shallow wells 130, 135, 140, 145 (optionally separated by ballasting), for example, as described above with reference to FIGS. 1A-1D. In the illustrated bond pad structure 700, the ESD protection circuitry includes two of the symmetric clamp structures 100c depicted in FIG. 1C, overlapping in a centrally located deep well 150. Functionally, the structure includes four devices adapted to conduct excess currents from power-high (i.e., drain) terminals 720 to power-low (i.e., source) terminals 722, as indicated by the arrows 724. In general, the clamp structure may include more or fewer devices. The doped regions are arranged in parallel and preferably elongated along their widths (i.e., the direction parallel to the boundaries between differently doped regions and perpendicular to the direction across device junctions). To distribute shunt currents evenly across the clamp structure, symmetric arrangements are preferred. Therefore, the clamp structure typically includes at least two devices (e.g., one structure 100c). Higher numbers of devices may serve to improve the collective current-carrying capacity of the clamp structure.

The drain and source terminals 720, 722 may be implemented in the patterned first metal layer 706 ("M1") above the semiconductor layer 708. A top view of this layer is shown in FIG. 8. The drain terminals 720 form narrow elongated conductive islands (or a single conductive island if a structure with only two clamp devices, such as structure 100c, is used) that are aligned with the drain regions of the clamp devices. The conductive islands have arrays of interconnecting vias 714 associated with them. Typical widths are in the range from 30 to 100 μm, and typical lengths are on the order of a few μm (e.g., 3-6). The source terminals 722 occupy a comparatively large, contiguous area between and around the drain terminals 720, and merge into a power-return bus 810. Drain and source terminals 720, 722 are separated by dielectric material. The transistor gates 160 are located to both sides of each drain terminal 720 in the dielectric-filled gap spaces, and elongated in the same direction as the drain terminals 720.

The vias 714 connect the drain terminals 720 to the second metal layer 704c ("M2"). Under normal operating conditions (i.e., in the absence of excess voltages), a power supply current is conducted from the bond pad top layer 702 through interjacent layers 704a, 704b to the M2-layer 704c, which contains the power-supply bus that carries the current to the core circuit and/or neighboring bond pad structures. (In the case of a bond pad connected to an input/output pin, the M2-layer includes, instead, a signal bus that carries a signal current from the bond pad to the core circuit.) Current flow in the power supply (or signal) bus to the core circuit may be perpendicular to the power-return bus (i.e., coming out of or going into the page in FIG. 7, and flowing upwards or downwards in FIG. 8. Alternatively or additionally, current may flow in a power-supply bus parallel to the power-return bus around the periphery of the IC. When an excess voltage occurs, however, the current is shunted through the islands 720 in the M1-layer 706 and the clamp transistors to the power-return bus 810. Because the transistor width is large, their current-carrying capacity is large as well. Further, since the transistor width is oriented perpendicular to the power-return bus 810, shunt currents can be effectively dissipated through the bus 810.

The power-return bus 810 is typically shared between multiple bond pads. For example, it may go along the entire periphery of the chip, along which the bond pads are typically located. The power-supply bus may likewise be shared between bond pads. However, integrated circuits often incorporate both low-voltage and high-voltage devices and, consequently, include both low-voltage and high-voltage power-supply buses as well as bond pads for low-voltage and high-voltage connections. In this case, the low-voltage power-supply bus may be routed around the low-voltage bond pads and vice versa. (The power-return bus may still be shared between low-voltage and high-voltage components.) Alternatively, to optimize IC space, improve reliability, minimize voltage dropped in the power rails, and lower the production cost, the low-voltage power-supply bus may go through the high-voltage bond pads.

Figure 9:
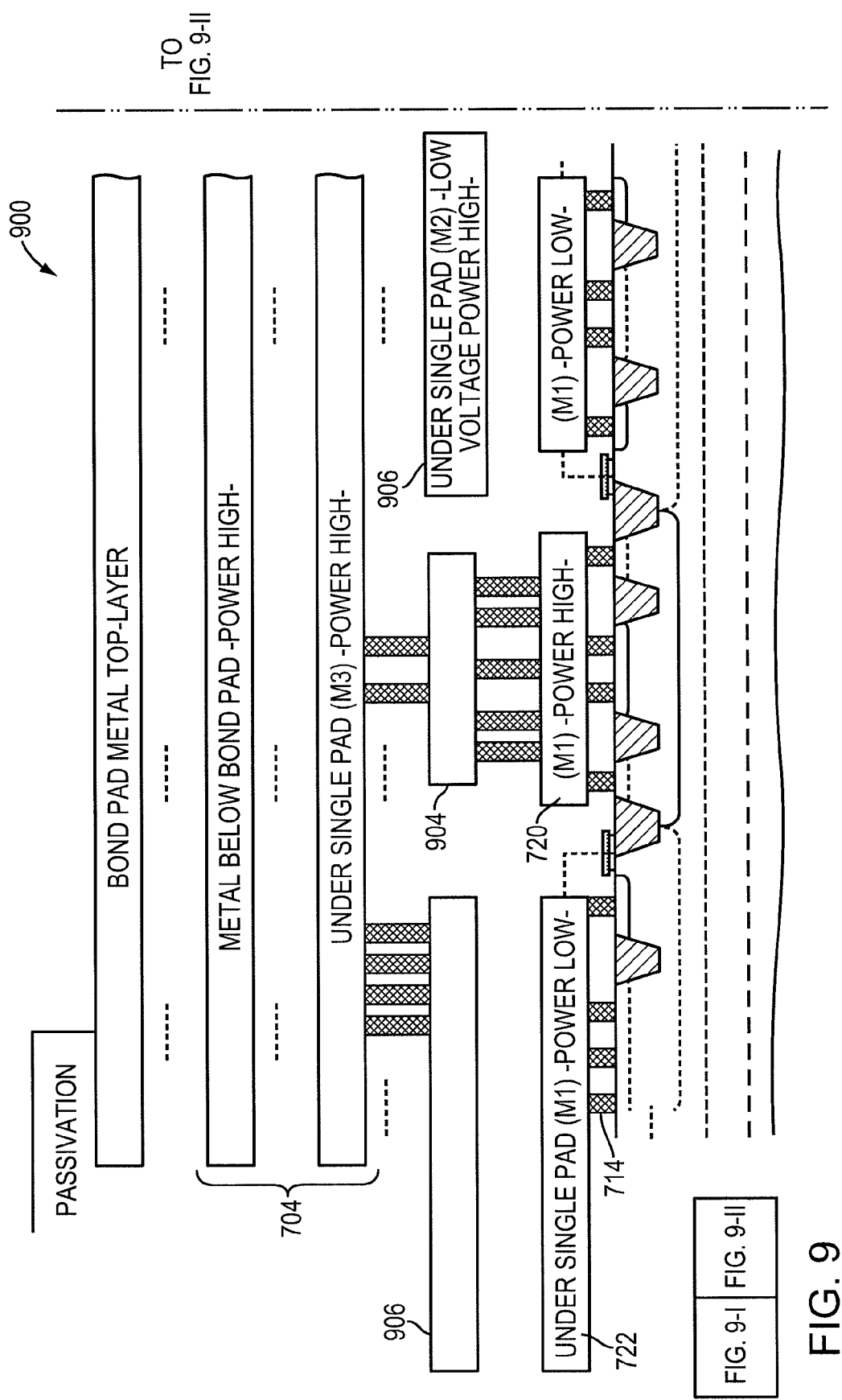
FIG. 9 is an exemplary sectional diagram of a bond pad structure with integrated clamp devices and adapted for integration with power supply buses at different voltages in accordance with one embodiment.

A bond pad embodiment that facilitates routing a low-voltage power-high bus through a high-voltage bond pad is illustrated in FIGS. 9 and 10A-10C. As shown in FIG. 9, the cross section of this exemplary bond pad structure 900 differs from that of the bond pad structure 700 shown in FIG. 7 in the structure of second metal layer 902 (M2), which includes conducting islands 904 surrounded by a contiguous metal region 906. The drain terminals 720 (i.e., the conductive islands in the M1-layer 706) are connected by vias 714, via the conductive islands 904 in the M2-layer 902, to the third metal layer 704b ("M3"). The high-voltage power supply bus is, in this embodiment, located in the M3 layer. The conductive area 902, on the other hand, is unconnected to the other metal layers 706, 704, and serves as a portion of the low-voltage power-high bus.

Figure 10A:
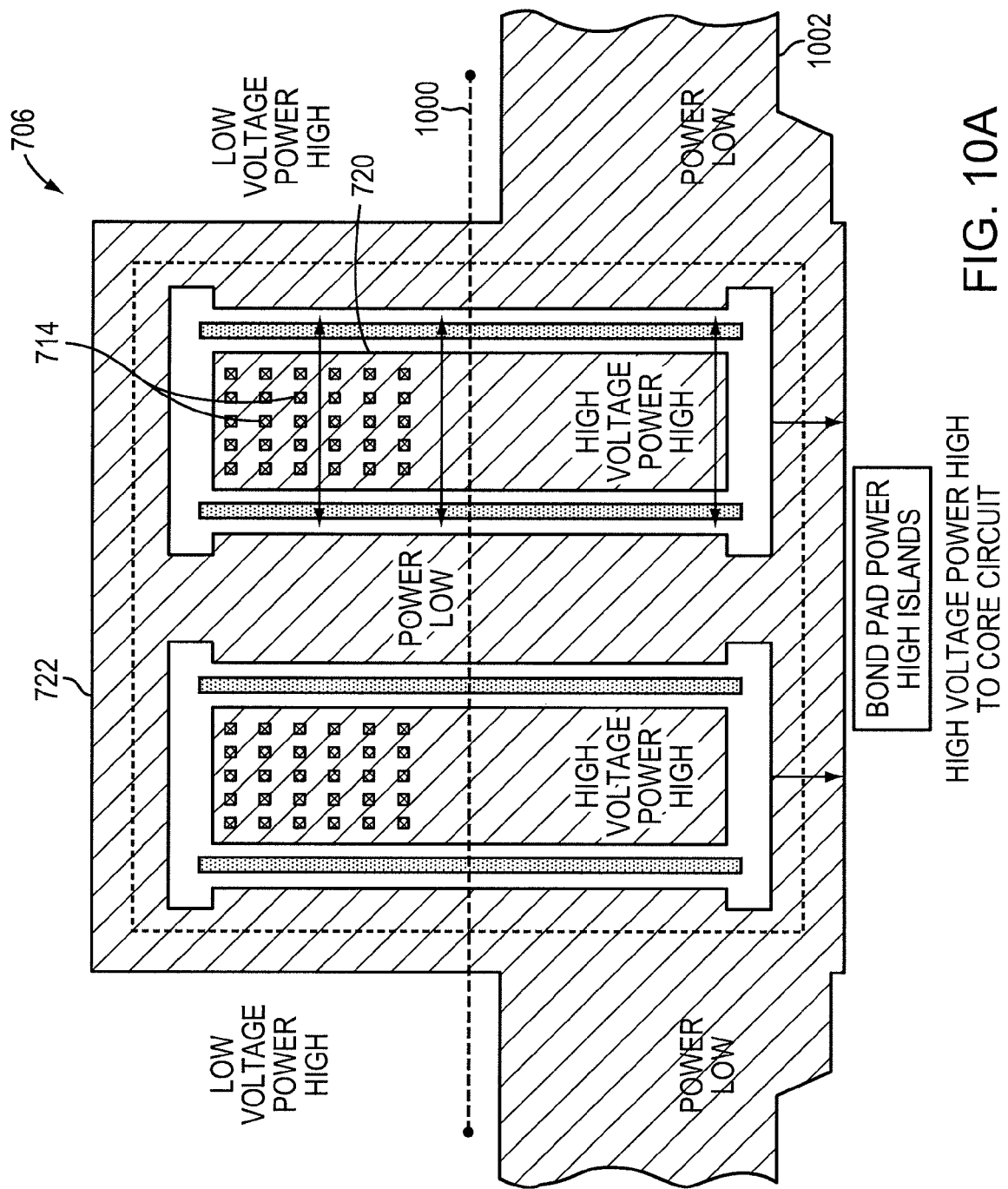
FIGS. 10A-10C are schematic top views of various layers of the bond pad structure depicted in FIG. 9 in accordance with one embodiment.
Figure 10B:
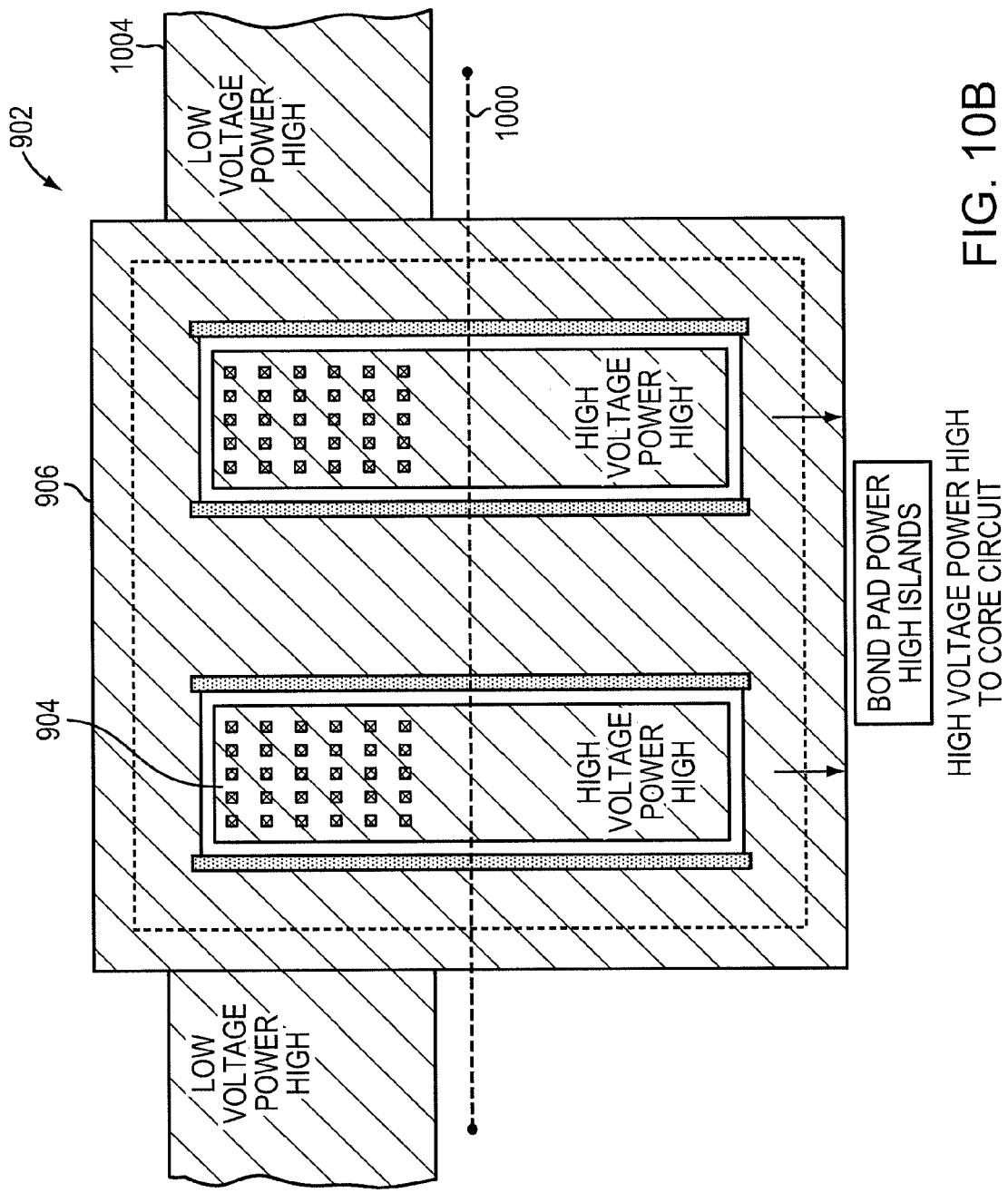
Figure 10C:
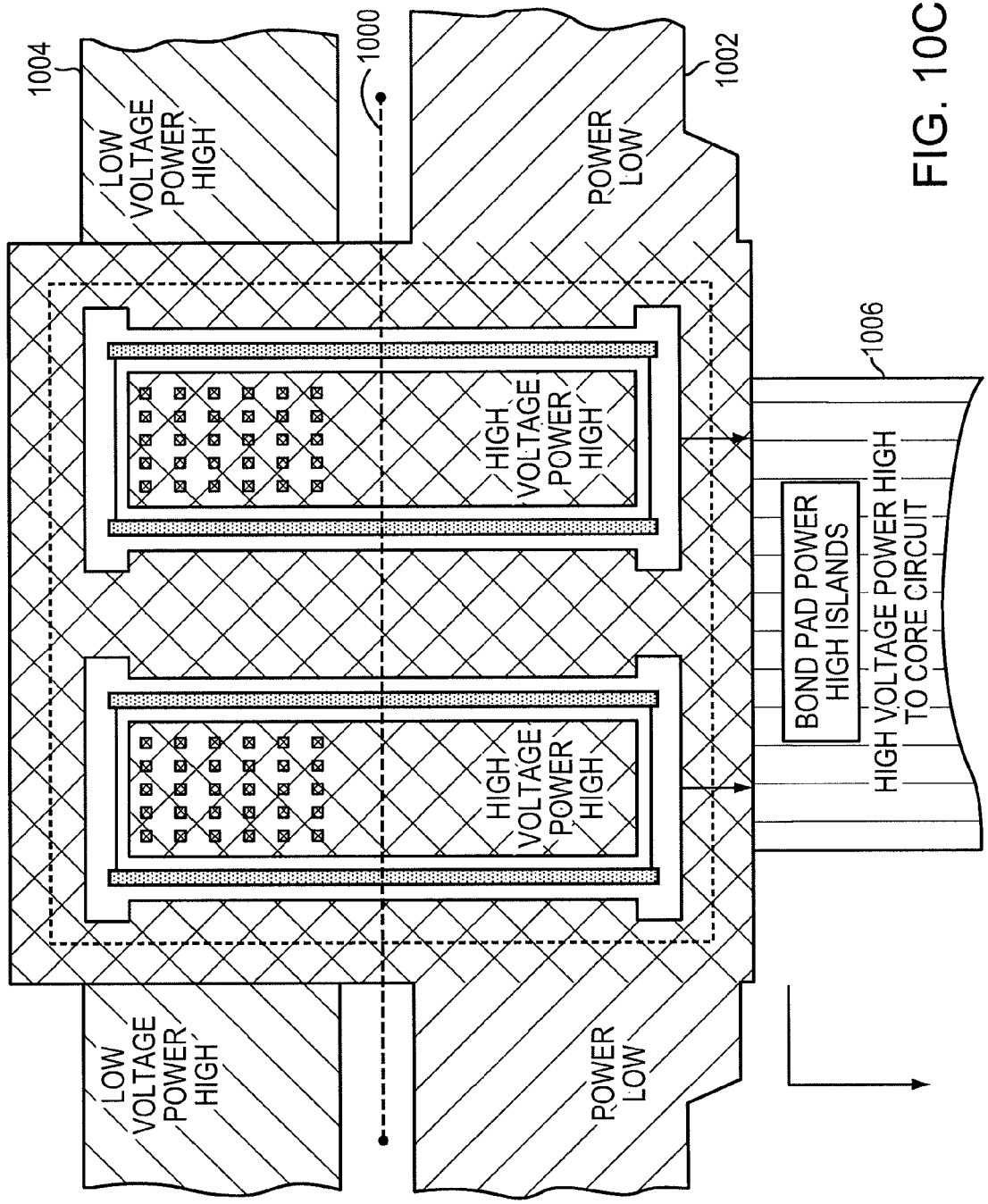

FIGS. 10A and 10B show top views of the first metal layer 706 (M1) and the second metal layer 902 (M2), respectively, which further illustrate the arrangement of the power buses. The dotted line 1000 indicates where the cross section shown in FIG. 9 is taken. In the M1-layer 706 (FIG. 10A), the source terminal 722 is connected to a power return bus 1002. However, the connection takes up only half the width of the bond pad structure, in contrast to the bond pad embodiment illustrated in FIG. 8. In the M2-layer 902 (FIG. 10B), the contiguous conductive region 906 merges into a low-voltage power supply return bus 1004, which likewise takes up only half the width of the bond pad. The conductive islands 720 are electrically isolated from both the M1 layer 706 and the M2 layer 902. FIG. 10C illustrates the superposition of these two layers 706, 902, and further shows the high-voltage power supply bus 1006, which lies in and is connected to the M3 layer 704b. The high-voltage power supply bus 1006 may be oriented parallel to the conductive islands, as illustrated.

Having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A bond pad structure comprising:
   a substrate comprising a plurality of planar over-voltage clamp devices including high-side regions and low-side regions, each device being elongated along a width thereof in a first direction;
   disposed above the substrate, a first, patterned metal layer comprising (i) at least one conductive island elongated in the first direction and aligned with and electrically connected to the high-side regions and (ii) a conductive area surrounding the at least one conductive island and electrically connected with the low-side regions; and
   a first bus oriented substantially perpendicular to the first direction and comprising at least a portion of the conductive area surrounding the at least one conductive islands,
   wherein the planar over-voltage clamp devices are configured to shunt currents, under over-voltage conditions, from the at least one conductive island to the first bus.

2. The bond pad structure of claim 1 wherein the first bus is a power-return bus.

3. The bond pad structure of claim 1 further comprising at least one second metal layer disposed above the first metal layer and electrically connected to the at least one conductive island.

4. The bond pad structure of claim 3 further comprising a second bus comprising at least a portion of the at least one second metal layer.

5. The bond pad structure of claim 4 wherein the second bus is one of a power-supply bus or a signal bus.

6. The bond pad structure of claim 4 wherein the second bus is oriented substantially parallel to the first direction.

7. The bond pad structure of claim 3 further comprising a top metal layer disposed above the at least one second metal layer and comprising a bonding area for bonding to a wire.

8. The bond pad structure of claim 3 wherein the at least one second metal layer comprises a lower, patterned metal layer and an upper, contiguous metal layer.

9. The bond pad structure of claim 8 further comprising a second bus comprising at least a portion of the lower, patterned metal layer and a third bus comprising at least a portion of the upper, contiguous metal layer.

10. The bond pad structure of claim 1 wherein the planar over-voltage clamp devices are mirror symmetric about an axis in the first direction.

11. The bond pad structure of claim 1 wherein the substrate comprises at an even number of planar over-voltage clamp devices.

12. The bond pad structure of claim 1 wherein the planar over-voltage clamp devices comprise bipolar junction transistors.

13. The bond pad structure of claim 1 wherein the planar over-voltage clamp devices comprise MOS structures.

14. The bond pad structure of claim 13 wherein the MOS structures each comprise:
   in the high-side region, a lightly doped first deep region of a first conductivity type;
   in the low-side region, adjacent the first deep region on opposite sides thereof, lightly doped second deep regions of a second conductivity type;
   formed in the first deep region, a highly doped first shallow drain region of the first conductivity type and, on opposite sides of the first shallow region, highly doped second shallow regions of the second conductivity type; and
   formed in each of the second deep regions, a highly doped third shallow source region of the first conductivity type, the first, second, and third shallow regions being elongated in the first direction.

15. The bond pad structure of claim 14 wherein the second shallow regions are electrically connected to the at least one conductive island.

16. The bond pad structure of claim 15 wherein the first shallow regions are electrically connected to the at least one conductive island.

17. The bond pad structure of claim 14 wherein the third shallow regions are electrically connected to the conductive area surrounding the at least one conductive island.

18. The bond pad structure of claim 17 wherein the planar MOS clamp devices further comprise highly doped fourth shallow regions formed in the second deep regions, the third shallow source regions being located between the second and the fourth shallow regions.

19. The bond pad structure of claim 18 wherein the fourth shallow regions are electrically connected to the conductive area surrounding the at least one conductive island.

20. The bond pad structure of claim 14 wherein the MOS structures further comprise gate structures, each gate structure comprising an insulating layer and a gate electrode disposed on the insulating layer, at least portions of the gate structures overlapping the second deep regions.

21. The bond pad structure of claim 14 wherein the MOS structures further comprise isolating barriers.

22. The device of claim 14 wherein the second shallow regions, the first and second deep regions, and the third shallow regions collectively have a thyristor-type response.

23. A bond pad structure comprising:
- (a) a substrate having a plurality of planar MOS structures operative as voltage clamps integrated therein, each voltage clamp comprising
  - (i) a gate structure;
  - (ii) on a first side of the gate structure, a first highly doped region of a first conductivity type; and
  - (iii) on a second side of the gate structure, a second highly doped region of the first conductivity type, wherein the second highly doped region is separated from the gate structure by (A) a third highly doped region of a second conductivity type, and (B) at least one of spacing or ballasting; and
- (b) disposed above the substrate, a first metal layer comprising at least one conductive island electrically connected to the second highly doped regions and a conductive area surrounding the at least one conductive island and electrically connected to the first highly doped regions.

24. The bond pad structure of claim 23 further comprising at least one second metal layer disposed above the first metal layer and electrically connected to the at least one conductive island.

25. The bond pad structure of claim 24 further comprising a top metal layer disposed above and electrically connected to the at least one second metal layer.

26. The bond pad structure of claim 23 wherein the at least one conductive island and the doped regions of the planar MOS structures are elongated in a first direction.

27. The bond pad structure of claim 26 further comprising a power-return bus oriented substantially perpendicular to the first direction and comprising at least a portion of the conductive area surrounding the at least one conductive island.

28. The bond pad structure of claim 23 wherein the planar MOS structures are configured to shunt currents, under overvoltage conditions, from the at least one conductive island to the power-return bus.

* * * * *